United States Patent [19]
Takagi

[11] Patent Number: 5,387,483
[45] Date of Patent: Feb. 7, 1995

[54] PROCESSING OF LITHOGRAPHIC PRINTING MATERIAL AND DEVELOPER USED THEREIN

[75] Inventor: Yoshihiro Takagi, Kanagawa, Japan

[73] Assignee: Fuji Photo Film Co., Ltd., Kanagawa, Japan

[21] Appl. No.: 160,826

[22] Filed: Dec. 3, 1993

[30] Foreign Application Priority Data

Dec. 11, 1992 [JP] Japan .................................. 4-353027

[51] Int. Cl.⁶ .............................................. G03C 5/54
[52] U.S. Cl. ................................... 430/204; 430/249; 430/251; 430/456; 430/485
[58] Field of Search ................................ 430/204, 249

[56] References Cited

U.S. PATENT DOCUMENTS

| | | | |
|---|---|---|---|
| 3,220,837 | 11/1965 | Land et al. | 430/204 |
| 3,591,376 | 7/1971 | Wilson et al. | 430/249 |
| 4,147,543 | 4/1979 | Kubotera et al. | 430/204 |
| 5,268,253 | 12/1993 | Van Rompuy | 430/204 |
| 5,272,041 | 12/1993 | Van Rompuy | 430/204 |
| 5,283,156 | 2/1994 | Monbaliu et al. | 430/204 |

*Primary Examiner*—Richard L. Schilling
*Attorney, Agent, or Firm*—Sughrue, Mion, Zinn, Macpeak & Seas

[57] ABSTRACT

Lithographic printing material is processed with a developer at pH 10.0 to 11.8 containing 30 to 80 gram/liter of hydroquinone in accordance with a diffusion transfer process. The developer is capable and stable. The resulting transfer silver image has improved printing endurance and ink receptivity.

4 Claims, No Drawings

PROCESSING OF LITHOGRAPHIC PRINTING MATERIAL AND DEVELOPER USED THEREIN

BACKGROUND OF THE INVENTION

1. Field of the Invention

This invention relates to a method for processing lithographic printing material in accordance with a silver salt diffusion transfer process and a developer used therein.

2. Prior Art

Offset printing plates utilizing silver images obtained by the silver complex diffusion transfer reversal (DTR) process are known from, for example, Japanese Patent Publication (JP-B) Nos. 43132/1971 and 30562/1973. Positive printing original plates are described in Japanese Patent Application Kokai (JP-A) No. 55402/1974 and negative ones are described in JP-A 106902/1977, JP-A 112402/1977, and EP 481562 A1.

These direct printing plates generally include an undercoat layer also serving for anti-halation, a silver halide emulsion layer, and a physical development nucleus layer on a support. On treatment of photosensitive material after imagewise exposure with a developer containing a developing agent and a silver halide solvent, silver halide having a latent image formed therein is converted to blackened silver in the emulsion layer while silver halide having no latent image therein is dissolved by the action of a silver halide complexing agent and diffused to the surface of the photosensitive material. The reducing action of the developing agent causes the silver complex salt to precipitate on physical development nuclei in the surface layer. A printing plate is obtained in this way. If desired to enhance the ink receptivity of silver images, development is followed by sensitization. The printing plate is mounted on an offset printing machine whereby ink images are transferred to ink-receptive sheets.

If solution and transfer take place prior to or during development, this lithographic printing plate is reduced in resolving power and fails to produce satisfactory transfer images. In order that development take place faster than solution, several proposals were made including the combination of a photosensitive material having a developing agent incorporated therein with an activator type solution (pH 13.0 or higher) and the use of a developer at pH 12.0 or higher to provide an increased development rate. However, the processing solution which is of the activator type or of higher pH is hazardous in handling, absorbs more carbon dioxide gas from air, experiences a frequent pH variation, and renders the developing agent susceptible to air oxidation.

On the other hand, if the developer for diffusion transfer is lowered in pH in order to improve the stability thereof, the development rate is retarded and the dissolving rate is relatively increased, failing to produce satisfactory transfer images.

For example, JP-A 071056/1984, 141561/1987, 282750/1990, and 049535/1984 disclose developers containing less than 20 grams of hydroquinone. JP-A 179744/1985, 071055/1984, 105147/1987, and 287357/1990 disclose activator solutions free of a developing agent. These processing solutions, however, suffer from greater variations of pH and composition.

JP-B 44733/1992 and 44734/1992, primarily relating to the amine amount, describe a developer containing more than 0.07 mol/liter (7.7 gram/liter) of dihydroxybenzene. However, since this developer is for block copy printing material and in practice, contains dihydroxybenzene in an amount of up to 12 gram/liter, it is inadequate as a processing solution for the lithographic printing material which requires improvements in stability, plate wear and ink receptivity.

Lithographic printing plates which use an internal latent image type direct reversal emulsion for producing negative diffusion transfer silver images have the problems that no satisfactory reversal images are obtained and plate wear and ink receptivity are aggravated if the processing solution has higher pH or contains less hydroquinone. There is a desire to improve the printing plate in these respects.

SUMMARY OF THE INVENTION

A primary object of the present invention is to provide a method for processing a direct lithographic printing material in accordance with a silver salt diffusion transfer process to produce a silver image, especially a negative transfer silver image, having improved printing endurance and increased ink receptivity.

Another object is to provide a developer which is stable and effective for yielding such an improved silver image.

The present invention pertains to a lithographic printing material comprising at least a silver halide emulsion layer and a physical development nucleus layer on a support. According to the present method, the lithographic printing material is processed with a developer in accordance with a diffusion transfer process. The developer should contain at least 30 gram/liter of hydroquinone and have a pH value of up to 11.8.

In one preferred embodiment, the developer is divided into one part for reversal development and another part for dissolution transfer development.

The silver halide emulsion layer is comprised of an internal latent image type emulsion in which the silver halide composition is silver chlorobromide having a bromine content of at least 45 mol % or silver bromide both of which may contain iodine on the surface. A negative transfer silver image is then obtained.

The developer may further contain a silver halide solvent which is at least one member selected from the group consisting of thiosulfates, cyclic imine compounds, mesoionic compounds, and amino-alcohol compounds.

The developer itself is also contemplated herein as being used in a lithographic printing material processing method as defined above.

DETAILED DESCRIPTION OF THE INVENTION

The developer used in the present invention contains at least 30 gram/liter, more preferably at least 35 gram/liter of hydroquinone. The upper limit is not critical although it is preferably 80 gram/liter, especially 70 gram/liter. The pH of the developer is 11.8 or lower. The lower limit of pH is not critical although it is preferably 10.0. The preferred range is between pH 11.2 and pH 10.0.

The developer containing at least 30 gram/liter of hydroquinone at pH 11.8 or lower is significantly stable as compared with the conventional developers commonly used for diffusion transfer. Processing with this developer contributes to improvements in printing endurance (plate wear) and ink receptivity probably because the ability of the developer gives favorable influence on the quality of transferred silver images. This is a surprising new discovery. The benefits become more outstanding with lithographic printing material based on an internal latent image type emulsion for producing negative diffusion transfer silver images.

If the developer contains less than 30 gram/liter of hydroquinone or has a higher pH value in excess of 11.8, it becomes less stable, fails to produce satisfactory transfer silver images, and adversely affects printability including printing endurance.

In addition to hydroquinone as the developing agent, the developer of the present invention may further contain any of the following developing agents.

A first exemplary class includes polyhydroxybenzenes excluding hydroquinone. Illustrative examples include catechol, chlorohydroquinone, pyrogallol, bromohydroquinone, isopropylhydroquinone, toluhydroquinone, methylhydroquinone, 2,3-dichlorohydroquinone, 2,5-dimethylhydroquinone, 2,3-dibromohydroquinone, 1,4-dihydroxy-2-acetophenone, 4-phenylcatechol, 4-t-butylcatechol, 4-n-butylpyrogallol, 4,5-dibromocatechol, 2,5-diethylhydroquinone, 2,5-benzoylaminohydroquinone, 4-benzyloxycatechol, and 4-n-butoxycatechol.

Another useful developing agent is a class of 3-pyrazolidone compounds, for example, 1-phenyl-3-pyrazolidone, 1-p-tolyl-3-pyrazolidone, 1-phenyl-4-methyl-3-pyrazolidone, 1-phenyl-4,4-dimethyl-3-pyrazolidone, 1-p-chlorophenyl-3-pyrazolidone, 1-p-methoxyphenyl-3-pyrazolidone, 1-phenyl-2-acetyl-3-pyrazolidone, 1-phenyl-5,5-dimethyl-3-pyrazolidone, 1-o-chlorophenyl-4-methyl-4-ethyl-3-pyrazolidone, 1-m-acetamidophenyl-4,4-diethyl-3-pyrazolidone, 1,5-diphenyl-3-pyrazolidone, 1-(m-tolyl)-5-phenyl-3-pyrazolidone, 4,4-dihydroxymethyl-1-phenyl-3-pyrazolidone, 4,4-dihydroxymethyl-1-tolyl-3-pyrazolidone, 4-hydroxymethyl-4-methyl-1-phenyl-3-pyrazolidone, and 4-hydroxymethyl-4-methyl-1-(p-chlorophenyl)-3-pyrazolidone.

Also useful are aminophenols, for example, p-(methylamino)phenol, p-aminophenol, 2,4-diaminophenol, p-(benzylamino)phenol, 2-methyl-4-aminophenol, and 2-hydroxymethyl-4-aminophenol.

Combinations of hydroquinone with 3-pyrazolidones are especially preferred. The 3-pyrazolidones are typically used in amounts of about 0.1% to about 30% by weight of the hydroquinone.

For adjusting the developer to pH 11.8 or lower, any of alkali agents and pH adjusting or buffering agents may be added in an appropriate amount. Examples of the alkali agent include hydroxides, carbonates and phosphates of alkali metals and ammonium, and examples of the pH adjusting agent include weak acids such as acetic acid and sulfuric acid, weak bases, and salts thereof.

Other various compounds may be added to the developer. Exemplary are development accelerators, for example, pyridinium compounds and cationic compounds as described in U.S. Pat. Nos. 2,648,604 and 3,671,247, potassium nitrate and sodium nitrate, polyethylene glycol condensates and derivatives thereof as described in U.S. Pat. Nos. 2,533,990, 2,577,127, and 2,950,970, nonionic compounds such as polythio ethers as typified by the compounds described in UKP 1,020,032 and 1,020,033, polymers having a sulfite ester as typified by the compounds described in U.S. Pat. No. 3,068,097, organic amines such as pyridine, ethanol amine and cyclic amines, benzyl alcohol, and hydrazines; antifoggants, for example, alkali chlorides, alkali bromides, alkali iodides, nitrobenzimidazoles as described in U.S. Pat. Nos. 2,496,940 and 2,656,271, mercaptobenzimidazole, 5-methylbenzotriazole, and 1-phenyl-5-mercaptotetrazole, compounds for rapid processing solutions as described in U.S. Pat. Nos. 3,113,864, 3,342,596, 3,295,976, 3,615,522, and 3,597,199, thiosulfonyl compounds as described in UKP 972,211, phenazine-N-oxides as described in JP-B 41675/1971, and fog suppressing agents as described in "Scientific Photography Manual", Mid Volume, pages 29–47; anti-stain or sludge agents as described in U.S. Pat. Nos. 3,161,513, 3,161,514, UKP 1,030,442, 1,144,481 and 1,251,558; and preservatives, for example, sulfites, acidic sulfites, hydroxylamine hydrochloride, formsulfite, and alkanolamine sulfite adducts. Also useful are metal blocking agents such as sodium hexametaphosphate and ethylenediaminetetraacetic acid and humectants such as saponin and ethylene glycol.

Further contained in the developer are silver halide solvents, for example, thiosulfates such as sodium thiosulfate, sodium thiocyanate, potassium thiocyanate, alkanol amines, cyclic imines such as uracil, aminoalcohols such as 2-methylaminoethanol, thiourea, meso-ionic compounds, thiosalicylic acid, and compounds capable of generating thiosalicylic acid in alkaline solution, such as 5-methylcarbamoylthiosalicylic acid, alone or in admixture of two or more. Preferred silver halide solvents are thiosulfates such as sodium thiosulfate, cyclic imines such as uracil, meso-ionic compounds, and amino-alcohols.

Preferred meso-ionic compounds are those of the following general formula:

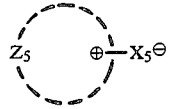

wherein $Z_5$ is a five or six-membered ring composed of atoms selected from the group consisting of carbon, nitrogen, oxygen, sulfur, and selenium atoms, and

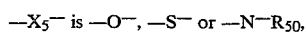

wherein $R_{50}$ is selected from the group consisting of an alkyl, cycloalkyl, alkenyl, alkynyl, aralkyl, aryl, and heterocyclic radical, Preferred among the meso-ionic compounds are those of the general formula:

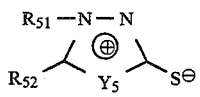

wherein $R_{51}$ and $R_{52}$ are independently selected from the group consisting of an alkyl, cycloalkyl, alkenyl, alkynyl, aralkyl, aryl, and heterocyclic radical, $R_{52}$ may also be a hydrogen atom, and

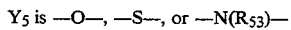

wherein $R_{53}$ is selected from the group consisting of an alkyl, cycloalkyl, alkenyl, alkynyl, aryl, heterocyclic, amino, acylamino, sulfonamido, ureido, and sulfamoylamino radical, and R₅₁ and R₅₂, and R₅₂ and R₅₃, taken together, may form a ring.
Illustrative, non-limiting examples of the meso-ionic compounds are given below.
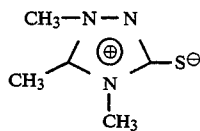
1.
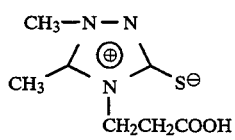
2.
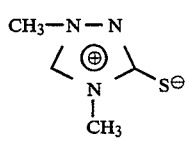
3.
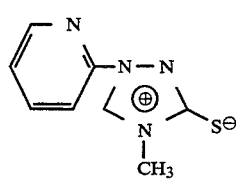
4.
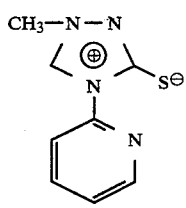
5.
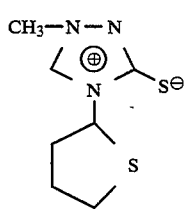
6.
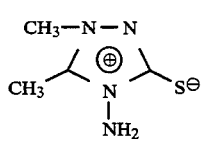
7.
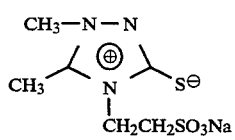
8.
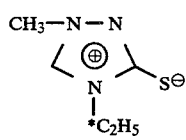
9.
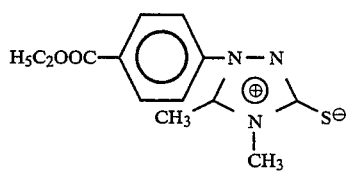
10.
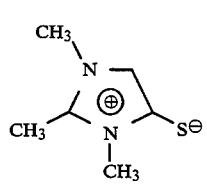
11.
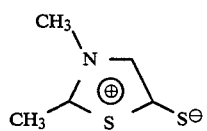
12.
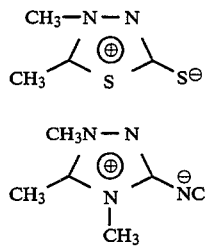
13.
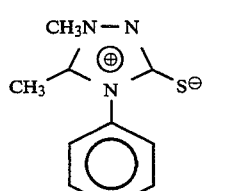
14.
15.
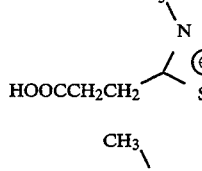
16.
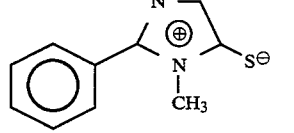
17.
18.
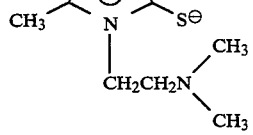
19.
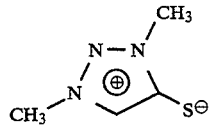

Preferred amino-alcohols are primary, secondary and tertiary amine compounds having at least one hydroryalkyl radical, with the secondary and tertiary amine compounds being more preferred. The amino-alcohols are generally of the following formula:

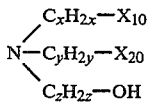

wherein $X_{10}$ and $X_{20}$ are independently a hydrogen atom, hydroxyl radical or amino radical, letters x and y are 0 or an integer of at least 1, and letter z is an integer of at least 1.

Exemplary amino-alcohols are ethanolamine, diethanoiamine, triethanolamine, diisopropanolamine, N-methylethanolamine(2-methylaminoethanol), N-aminoethylethanolamine, N,N-diethylethanolamine, N,N-dimethylethanolamine, N-methyldiethanolamine, N-ethyldiethanolamine, 3-aminopropanol, 1-amino-propan-2-ol, 4-aminobutanol, 5-amino-pentan-1-ol, 3,3'-iminodipropanol, and N-ethyl-2,2'-iminodiethanol. Also useful are 2-amino-2-(hydroxymethyl)propane-1,3-diol and 2-amino-2-methylpropane-1,3-diol. The amino-alcohols described in JP-B 61655/1988 may also be used.

These silver halide solvents are preferably contained in the developer in amounts of about 0.1 to about 80 gram/liter.

Lithographic printing material using an internal latent image type emulsion for producing a negative transfer silver image can be processed either by a diffusion transfer process with a developer having a low silver halide dissolving power or by dividing a developer into two parts, one part for reversal development and another part for solution transfer development as described in JP-B 31694/1984. The reversal development solution is a developer in which the dissolving power is reduced by a proper choice of the type and amount of solvent and the second solution for solution transfer development is a developer having a high dissolving power for causing undeveloped silver halide to be transferred to physical development nuclei. Therefore, in the case of negative lithographic printing material, the two bath process is advantageous because of an increased silver transfer amount and improved printing endurance.

According to the present invention, both the developers should contain at least 30 gram/liter of hydroquinone and have a pH value of up to 11.8, preferably 11.2 to 10.0.

In the processing method of the present invention using the above-defined developer, the preferred processing conditions include a temperature of about 20° to 40° C. and a time of about 10 to 60 seconds in the case of a single bath system developer. In the case of the two bath system considered advantageous for the processing of negative lithographic printing material, the preferred processing conditions include a temperature of about 20° to 40° C. and a time of about 10 to 60 seconds for the first bath and a temperature of about 20° to 40° C. and a time of about 10 to 60 seconds for the second bath.

A neutral solution is used for stopping development if necessary after the development of lithographic printing material according to the present invention. The neutral solution may be a conventional acidic stop bath which is often adjusted to pH 3.0 to 8.0. The neutral solution may contain a water softening agent, pH adjusting agent, buffer agent, hardener or the like and additionally, colloidal silica and polyols for the purpose of eliminating ink stains on the printing plate being processed therewith.

After the lithographic printing material is processed to yield a printing plate as mentioned above, any post-treatment may be carried out in order to improve the printability. For example, ink receptivity can be improved by the methods described in U.S. Pat. Nos. 3,592,647, 3,490,906, and 3,161,508, JP-B 10910/1971, 29723/1973, 15762/1976, and 15762/1977.

The lithographic printing material of the invention may have a silver halide developing agent incorporated in any of its layers, whereby the development after exposure can be an activating treatment with an aqueous alkaline solution. However, the development is done with the developer defined herein according to the invention because better photographic and printing properties are available.

The developing agent can be contained in a silver halide emulsion layer, an anti-halation layer or a layer adjacent thereto (an undercoat or intermediate layer), most preferably in the anti-halation layer.

When incorporated in a layer of lithographic printing material, the developing agents may be used alone or in combination. Combinations of a hydroxybenzene and a 3-pyrazolidone are especially preferred. The amount of the developing agent in the layer is not fixed although it is preferably in the range of 0.001 gram to 1 gram per square meter, and when added to the silver halide emulsion layer, in the range of 0.01 gram to 3 gram per gram of silver halide.

If desired, a compound, known as a complexing agent, which tends to form a soluble silver complex with silver halide in unexposed areas may be contained in any layer for advantageously accelerating physical development. The complexing agents include thiosulfates, thiocyanates, amine thiosulfates as described in U.S. Pat. No. 3,169,962, cyclic imides as described in U.S. Pat. No. 2,857,276, and mercapto compounds as described in JP-B 11957/1971.

The developing agent may be added to a coating solution by dissolving it in water or a hydrophilic solvent such as methanol or by dissolving it in a high or low-boiling organic solvent. The high-boiling organic solvents are those having a boiling point of higher than about 180° C., for example, alkyl phthalates such as ethyl phthalate and n-butyl phthalate and phosphates such as tricresyl phosphate. The low-boiling organic solvents are those having a boiling point between about 30° C. and about 150° C., for example, lower alkyl acetates such as ethyl acetate and butyl acetate. These high and low-boiling organic solvents may be used in admixture. The thus dissolved developing agent can be dispersed in hydrophilic colloid by any of well-known techniques.

When the developing agent is added to any one or more of the layers of the lithographic printing material according to the invention, it can be added directly to the layer. Alternatively, its solution is added to gelatin or synthetic polymers such as polyvinyl alcohol, polyvinyl pyrrolidone, alkyl acrylates as described in U.S. Pat. No. 3,488,708, sulfoalkyl acrylates and copolymers of acrylic acid.

The lithographic printing material of the present invention is generally in the form of a silver salt offset printing material of a basic layer structure including an anti-halation layer as a undercoat on a support, a photosensitive silver halide emulsion layer on the undercoat, and a physical development nucleus layer on the emulsion layer. An intermediate layer may be interposed between any two adjacent layers. Preferably, the printing material of the invention has a physical development nucleus layer disposed directly on a photosensitive silver halide emulsion layer.

The anti-halation layer disposed nearest to the support is a hydrophilic colloid layer having carbon black dye or pigment dispersed therein. To impart printability to the anti-halation layer or emulsion layer, fine powder having a size of 1 to 10 μm such as silica may be added.

The silver halide composition of the photosensitive silver halide emulsion layer used herein is preferably silver chlorobromide having a bromine content of up to 55 mol % or silver chloride, which may both contain iodine on the surface, in the case of a surface latent image type emulsion used in a positive lithographic printing material. In the case of an internal latent image type emulsion used in a negative lithographic printing material, the silver halide composition is silver chlorobromide having a bromine content of at least 45 mol % or silver bromide, which may both contain iodine on the surface. As to the crystal habit, the silver halide grains may have a regular crystal form such as cube, octahedron, and tetradecahedron (14 sided), with the cubic or octahedral grains being preferred. When iodine is contained, its content should preferably be up to 1 mol % of the entire silver halide.

Silver halide containing iodine on the surface is obtained by modifying the process of preparing a silver halide emulsion after grain formation, namely adding an iodine-containing solution such as KI solution to the emulsion to thereby partially incorporate iodine only at the surface through conversion with halogen (such as Br and Cl) at the surface. Then iodine is contained at the outer surface of grains and in a surface layer extending from the outer surface to about 5 to 0.5% of the mean grain size (that is, a surface layer of 0.05 to 0.005 μm thick). In the case of core/shell type grains, iodine may be incorporated after the shell is formed, similarly using an iodine-containing solution.

The silver halide emulsion is prepared by conventional techniques well known in the art, for example, single jet, double jet and controlled jet techniques.

The silver halide grains preferably have a mean grain size of about 0.05 to 2.0 μm, more preferably from about 0.15 to 1.0 μm.

After grain formation, soluble salts are removed from the silver halide emulsion in a conventional manner. After desalting, the emulsion may be chemically sensitized with sulfur sensitizing agents such as thiosulfates, allyl thiocarbamide, thiourea, and allyl isothiacyanate. Further the emulsion may be ripened with gold compounds as disclosed in U.S. Pat. No. 2,399,083, 2,597,856, and 2,597,915 or salts of noble metals such as platinum, gold, palladium, iridium, rhodium, and ruthenium as disclosed in U.S. Pat. No. 2,448,060, 2,540,086, 2,566,245, 2,566,263, and 2,598,079.

Where an internal latent image type emulsion is used in a lithographic printing material for producing a negative transfer silver image, a nucleating agent is used, most often in the emulsion layer. The term "nucleating agent" used herein is a compound which acts to form a direct positive image upon surface development of a previously unfogged internal latent image type silver halide emulsion. The nucleating agent is preferably selected from compounds of the following general formulae (I) and (II).

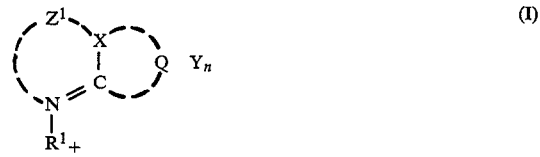

In formula (I), $Z^1$ is a group of non-metallic atoms necessary to form a five- or six-membered heterocyclic ring which may have an aromatic or heterocyclic ring fused thereto, $R^1$ is an aliphatic radical, X is a radical represented by

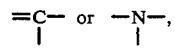

Q is a group of non-metallic atoms necessary to form a 4 to 12-membered non-aromatic hydrocarbon ring or a non-aromatic heterocyclic ring, at least one of $R^1$, the substituent on $Z^1$, and the substituent on Q containing an alkynyl radical, at least one of $R^1$, $Z^1$, and Q may have a radical capable of promoting adsorption to silver halide, Y is an electric charge balancing counter ion, and letter n has a value necessary to provide an electric charge balance.

In formula (II), $R^{21}$ is an aliphatic, aromatic or heterocyclic radical, $R^{22}$ is selected from the group consisting of a hydrogen atom, an alkyl, aralkyl, aryl, alkoxy, aryloxy, and amino radical, G is selected from the group consisting of a carbonyl radical, sulfonyl radical, sulfoxy radical, phosphoryl radical, and iminomethylene radical: HN=C<, both $R^{23}$ and $R^{24}$ are hydrogen atoms, or one of $R^{23}$ and $R^{24}$ is a hydrogen atom and the other is an alkylsulfonyl, arylsulfonyl or acyl radical, and G, $R^{23}$, and $R^{24}$ may form with the hydrazine nitrogen atoms a hydrazone structure of the formula: $>N-N=C<$.

All the foregoing radicals may have one or more substituents if possible.

First the nucleating agent of formula (I) is described in further detail.

The heterocyclic rings completed by $Z^1$ include quinolinium, benzimidazolium, pyridinium, thiazolium, selenazolium, imidazolium, tetrazolium, indolenium, pyrrolidinium, phenanthridinium, isoguinolinium, and naphthopyridiniumnuclei. $Z^1$ may have a substituent, for example, an alkyl radical, alkenyl radical, aralkyl radical, aryl radical, alkynyl radical, hydroxy radical, alkoxy radical, aryloxy radical, halogen atom, amino radical, alkylthio radical, arylthio radical, acyloxy radical, acylamino radical, sulfonyl radical, sulfonyloxy radical, sulfonylamino radical, carboxyl radical, acyl radical, carbamoyl radical, sulfamoyl radical, sulfo radical, cyano radical, ureido radical, urethane radical, carbonate radical, hydrazine radical, hydrazone radical, and imino radical. The substituent on $Z^1$ is at least one selected from the foregoing examples and where there is more than one substituent, they may be identical or different. The substituent may be further replaced by such a substituent.

The substituent on $Z^1$ may have a heterocyclic quaternary ammonium radical completed by $Z^1$ through an appropriate linkage $L^1$ to be described later. In this case, a so-called dimer structure is formed.

Preferred examples of the heterocyclic nucleus completed by $Z^1$ include guinolinium, benzimidazolium, pyridinium, acridinium, phenanthridinium, naphthopyridinium, and isoquinolinium nuclei. Among these, quinolinium, naphthopyridinium, and benzimidazolium nuclei are more preferred, and quinolinium nuclei are most preferred.

The aliphatic radicals represented by $R^1$ include unsubstituted alkyl radicals having 1 to 18 carbon atoms and substituted alkyl radicals in which the alkyl moiety has 1 to 18 carbon atoms. The substituents on the alkyl radical are the same as the substituents on $Z^1$. Preferred radicals of $R^1$ are alkynyl radicals, especially propargyl radicals.

Q is a group of non-metallic atoms necessary to form a 4 to 12-membered non-aromatic hydrocarbon ring or non-aromatic heterocyclic ring. These rings may be replaced by a substituent similar to the substituents on $Z^1$.

The non-aromatic hydrocarbon rings are formed where X is a carbon atom and include such rings as cyclopentane, cyclohexane, cyclohexene, cycloheptane, indane, and tetralin. The non-aromatic heterocyclic rings may have nitrogen, oxygen, sulfur or selenium as the hetero atom. Where X is a carbon atom, there are included such rings as tetrahydrofuran, tetrahydropyran, butyrolactone, pyrrolidone, and tetrahydrothiophene. Where X is a nitrogen atom, there are included such rings as pyrrolidine, piperidine, pyridone, piperazine, perhydrothiadine, tetrahydroquinoline, and indoline.

Preferred ring nuclei formed by Q are those where X is a carbon atom, especially cyclopentane, cyclohexane, cycloheptane, cyclohexeneindane, tetrahydropyran, and tetrahydrothiophene.

At least one of $R^1$, the substituent on $Z^1$, and the substituent on Q contains an alkynyl radical. The alkynyl radicals, which have been partially described herein, are preferably those having 2 to 18 carbon atoms, for example, ethynyl, propargyl, 2-butynyl, 1-methylpropargyl, 1,1-dimethylpropargyl, 3-butynyl, and 4-pentynyl radicals. They may be replaced by a substituent similar to the substituents on $Z^1$. Preferred alkynyl radicals are propargyl radicals. Most preferably $R^1$ is a propargyl radical.

At least one of $R^1$, $Z^1$, and Q may have a radical capable of promoting adsorption to silver halide. The adsorption promoting radical is preferably represented by $X^1$—$(L^1)_{m'}$— wherein $X^1$ is a radical capable of promoting adsorption to silver halide; $L^1$ is a divalent linkage; and m' is equal to 0 or 1.

The adsorption promoting radicals represented by $X^1$ include thioamide, mercapto, and five or six-membered nitrogenous heterocyclic radicals. They may be replaced by a substituent similar to the substituents on $Z^1$. Preferred thioamide radicals are non-cyclic thioamide radicals such as thiourethane and thioureido radicals. Preferred mercapto radicals are heterocyclic mercapto radicals such as 5-mercaptotetrazole, 3-mercapto-1,2,4-triazole, 2-mercapto-1,3,4-thiadiazole, and 2-mercapto-1,3,4-oxadiazole. Preferred five or six-membered nitrogenous heterocyclic radicals are those based on a combination of nitrogen, oxygen, sulfur and carbon atoms, more preferably capable of forming imino silver, for example, benzotriazole and aminothiazole.

$L^1$ is a divalent linkage which includes an atom or a group of atoms selected from C, N, S and O. Illustrative divalent linkages include alkylene radicals, alkenylene radicals, alkynylene radicals, arylene radicals, —O—, —S—, —NH—, —N=, —CO—, and —SO$_2$— alone or in a combination thereof, while all these radicals may have a substituent. Exemplary combinations are given below.

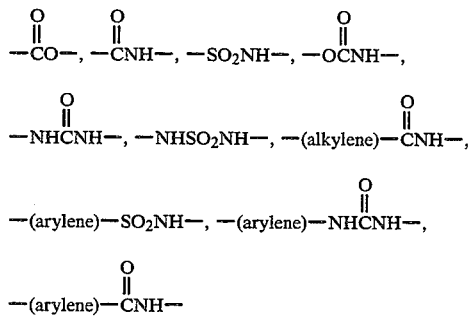

Y is an electric charge balancing counter ion, for example, a bromide ion, chloride ion, iodide ion, p-toluene sulfonate ion, ethylsulfonate ion, perchlorate ion, trifluoromethanesulfonate ion, thiocyan ion, $FB_4$—, and $PF_6$—.

Preferred among the compounds of fomula (I) are those having a radical capable of promoting adsorption to silver halide, especially those wherein the adsorption promoting radical $X^1$ is a thioamide, azole or heterocyclic mercapto radical. Examples of these compounds and their synthesis are described, for example, in JP-A 301942/1988 and the publications cited therein.

Illustrative, non-limiting examples of the compound of fomula (I) are given below.

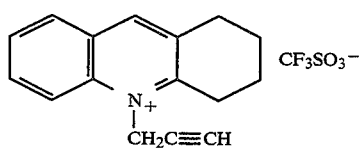

(N-I-1)

-continued
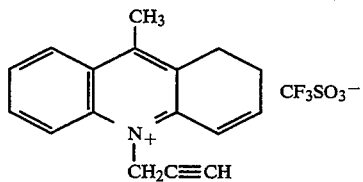 (N-I-2)
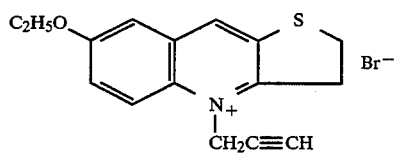 (N-I-3)
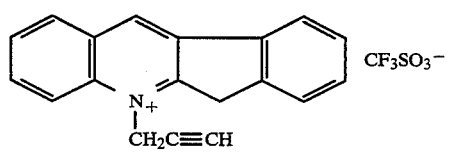 (N-I-4)
 (N-I-5)
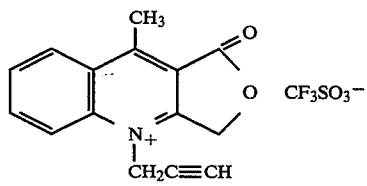 (N-I-6)
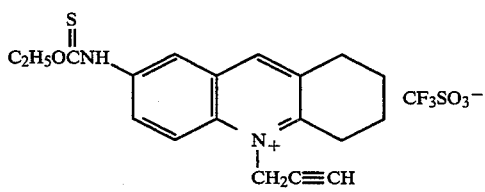 (N-I-7)
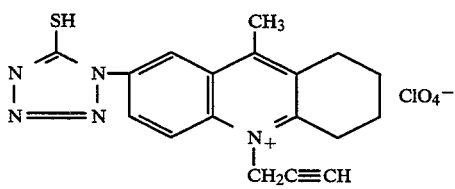 (N-I-8)
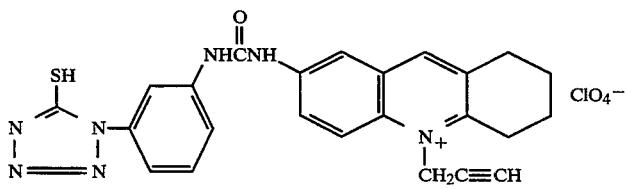 (N-I-9)
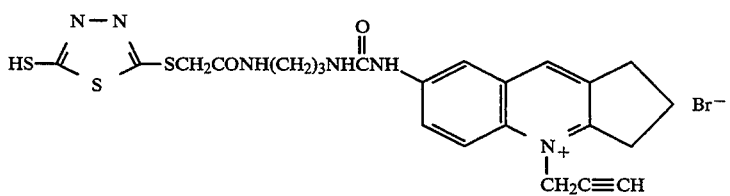 (N-I-10)

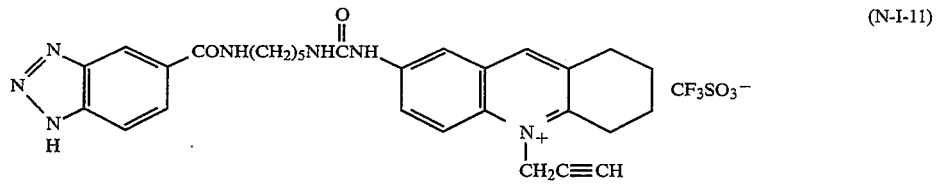
(N-I-11)
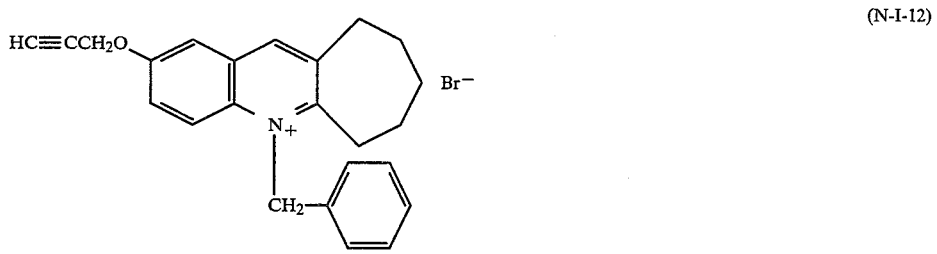
(N-I-12)
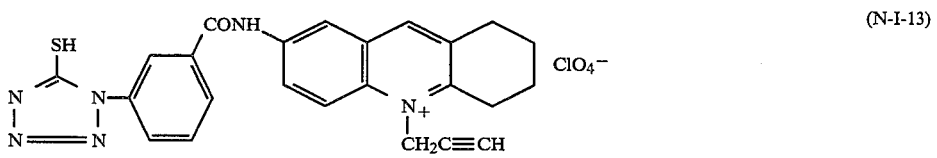
(N-I-13)
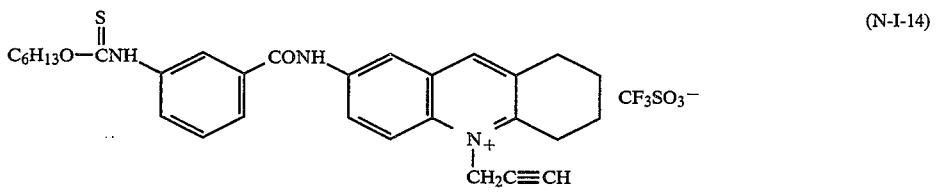
(N-I-14)
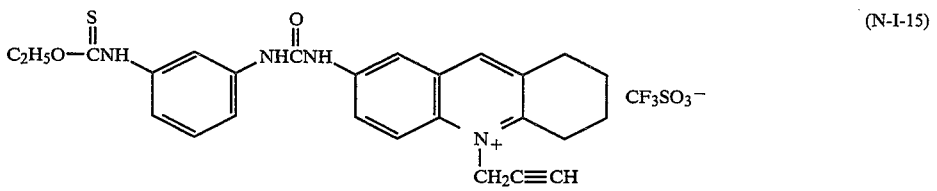
(N-I-15)
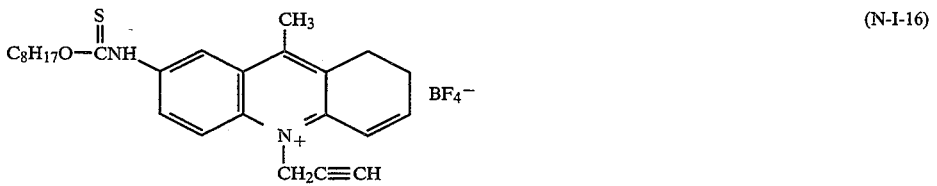
(N-I-16)
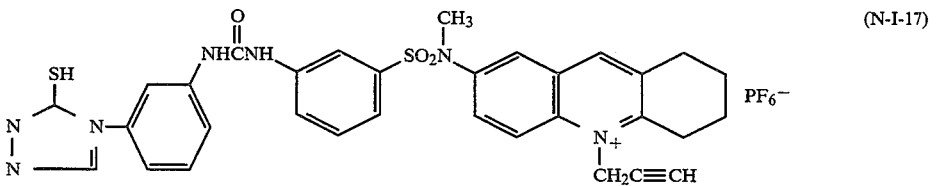
(N-I-17)
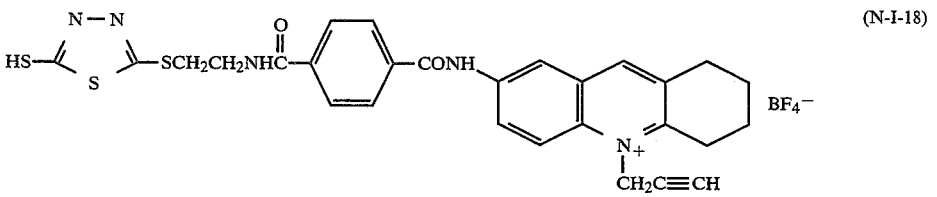
(N-I-18)

-continued

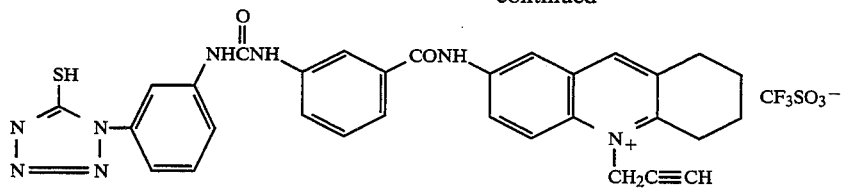
(N-I-19)

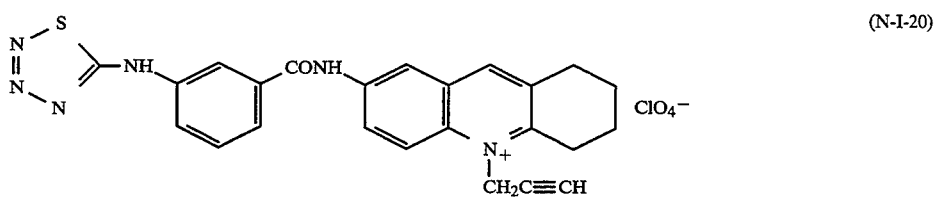
(N-I-20)

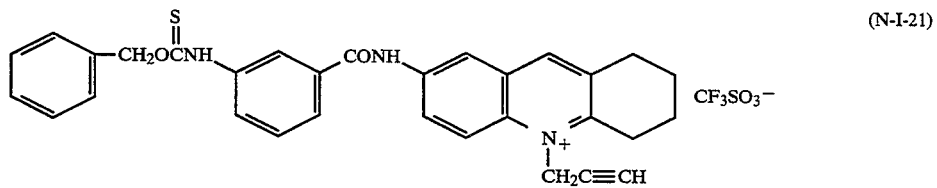
(N-I-21)

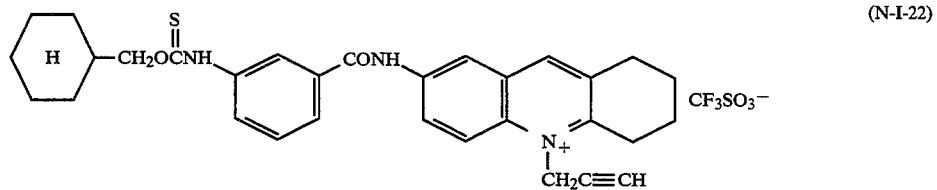
(N-I-22)

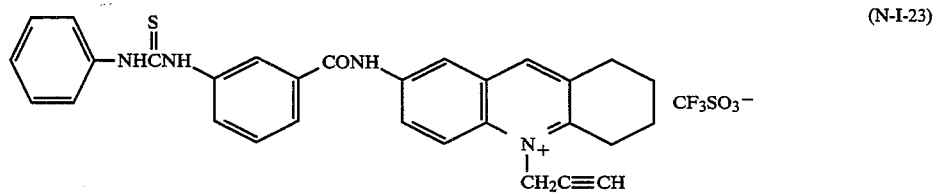
(N-I-23)

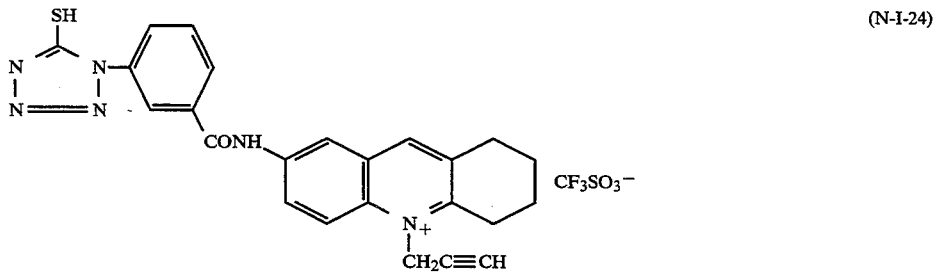
(N-I-24)

The aforementioned compounds can be synthesized by the methods described, for example, in the patents cited in Research Disclosure, No. 22534 (January 1983, pages 50-54) and U.S. Pat. No. 4,471,044 or analogous methods.

Next the nucleating agent of formula (II) is described in further detail.

In formula (II), $R^{21}$ is an aliphatic, aromatic or heterocyclic radical; $R^{22}$ is selected from the group consisting of a hydrogen atom, an alkyl, aralkyl, aryl, alkoxy, aryloxy, and amino radical; G is selected from the group consisting of a carbonyl radical, sulfonyl radical, sulfoxy radical, phosphoryl radical, and iminomethylene radical: $HN=C<$; both $R^{23}$ and $R^{24}$ are hydrogen atoms, or one of $R^{23}$ and $R^{24}$ is a hydrogen atom and the other is an alkylsulfonyl, arylsulfonyl or acyl radical; and G, $R^{23}$, and $R^{24}$ may form with the hydrazine nitrogen atoms a hydrazone structure of the formula: $>N-N=C<$. All these radicals may have a substituent thereon if possible.

The aliphatic radicals represented by $R^{21}$ include linear, branched or cyclic alkyl, alkenyl and alkynyl radicals. The aromatic radicals represented by $R^{21}$ include monocyclic and dicyclic aryl radicals, for example, phenyl and naphthyl radicals. The heterocyclic radicals represented by $R^{21}$ include 3- to 10-membered saturated or unsaturated heterocyclic rings containing at least one of N, O and S atoms, which may be monocyclic or form a condensed ring with another aromatic or heterocyclic ring. Preferred heterocyclic rings are five- or six-membered aromatic heterocyclic rings, for example, pyridyl, quinolinyl, imidazolyl, and benzimidazolyl radicals.

The radicals represented by $R^{21}$ may have a substituent. Examples of the substituent include alkyl radicals, aralkyl radicals, alkoxy radicals, alkyl or aryl-substituted amino radicals, acylamino radicals, sulfonylamino radicals, ureido radicals, urethane radicals, aryloxy radicals, sulfamoyl radicals, carbamoyl radicals, aryl radicals, alkylthio radicals, arylthio radicals, sulfonyl radicals, sulfinyl radicals, hydroxy radicals, halogen atoms, cyano radicals, sulfo radicals, and carboxyl radicals, all of which may be further replaced by a substituent. These substituents may be combined together to form a ring if possible.

Preferred radicals represented by $R^{21}$ are aromatic radicals, aromatic heterocyclic radicals and aryl-substituted methyl radicals, with aryl radicals being most preferred.

$R^{22}$ is selected from the group consisting of a hydrogen atom, an alkyl, aralkyl, aryl, alkoxy, aryloxy, and amino radical. Preferably, where G is a carbonyl radical, $R^{22}$ is a hydrogen atom, an alkyl radical (e.g., methyl, trifluoromethyl, 3-hydroxypropyl, and 3-methanesulfonamidopropyl radicals), an aralkyl radical (e.g., o-hydroxybenzyl radical), or an aryl radical (e.g., phenyl, 3,5-dichlorophenyl, o-methanesulfonamidophenyl and 4-methanesulfonylphenyl radicals), with the hydrogen atom being more preferred. Where G is a sulfonyl radical, $R^{22}$ is preferably an alkyl radical (e.g., methyl radical), an aralkyl radical (e.g., o-hydroxyphenylmethyl radical), an aryl radical (e.g., phenyl radical) or a substituted amino radical (e.g., dimethylamino radical).

The radicals represented by $R^{22}$ may have a substituent which may be selected from those enumerated for $R^{21}$ as well as acyl, acyloxy, alkyl- or aryloxycarbonyl, alkenyl, alkynyl and nitro radicals. These substituents may be further replaced by such substituents. Also these substituents may be combined together to form a ring if possible.

Preferably $R^{21}$ or $R^{22}$, especially $R^{21}$ contains a non-diffusion radical such as couplers, known as a ballast radical. The ballast radical used herein is an alkyl radical, phenyl radical, ether radical, amide radical, ureido radical, urethane radical, sulfonamide radical, or thioether radical, all having at least 8 carbon atoms, or a combination thereof.

$R^{21}$ and $R^{22}$ may have a radical capable of promoting the compound of formula (II) adsorbing to the surface of silver halide grains. The adsorption promoting radical is represented by $X^2$—$(L^2)_{m''}$— wherein $X^2$ is as defined for $X^1$; $L^2$ is a divalent linkage as defined for $L^1$; and $m''$ is equal to 0 or 1.

Preferably $X^2$ is a thioamide radical (excluding thiosemicarbazide and substituted ones thereof), a mercapto radical or a five- or six-membered nitrogenous heterocyclic radical. More preferably $X^2$ is selected from cyclic thioamide radicals (that is, mercapto-substituted nitrogenous heterocyclic radicals, for example, 2-mercaptothiadiazole, 3-mercapto-1,2,4-triazole, 5-mercaptotetrazole, 2-mercapto-1,3,4-oxadiazole, and 2-mercaptobenzoxazole radicals) and nitrogenous heterocyclic radicals (for example, benzotriazole, benzimidazole and indazole radicals).

G is selected from the group consisting of a carbonyl radical, sulfonyl radical, sulfoxy radical, phosphoryl radical, and iminomethylene radical: HN=C<, with the carbonyl radical being most preferred.

$R^{23}$ and $R^{24}$ are both hydrogen atoms, or one of $R^{23}$ and $R^{24}$ is a hydrogen atom and the other is an alkylsulfonyl, arylsulfonyl or acyl radical. Most preferably both $R^{23}$ and $R^{24}$ are hydrogen atoms.

Preferred compounds of formula (II) should have a radical capable of adsorbing to silver halide. Preferred adsorbing radicals are mercapto, cyclic thioamide and nitrogenous heterocyclic radicals as previously described in conjunction with formula (I).

Illustrative, non-limiting examples of the compound of formula (II) are given below.

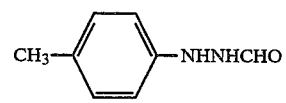

(N-II-1)

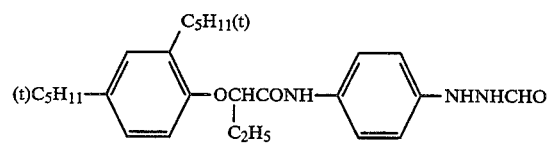

(N-II-2)

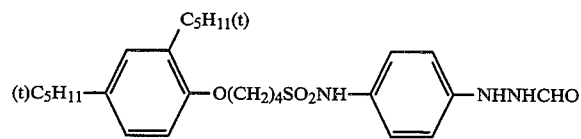

(N-II-3)

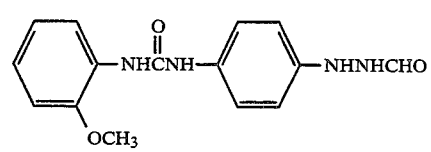

(N-II-4)

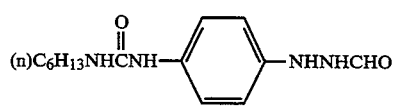 (N-II-5)
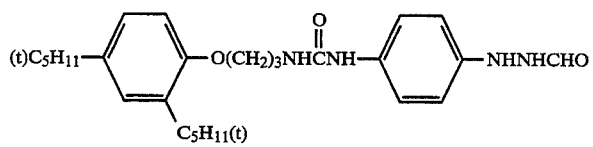 (N-II-6)
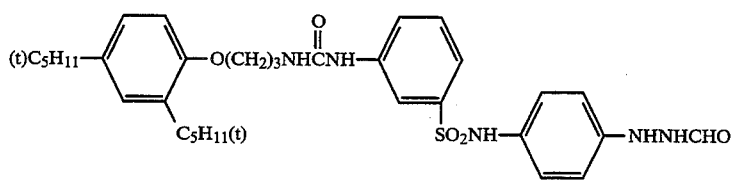 (N-II-7)
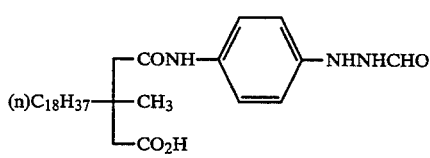 (N-II-8)
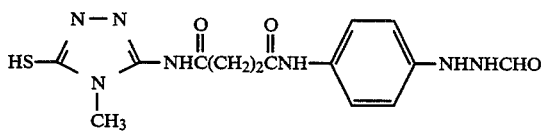 (N-II-9)
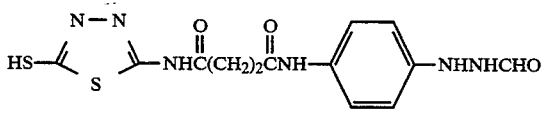 (N-II-10)
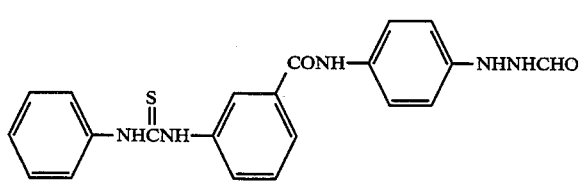 (N-II-11)
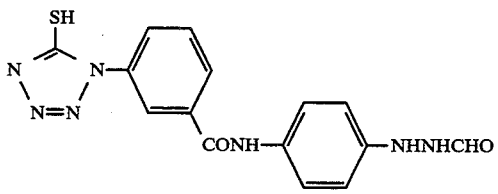 (N-II-12)
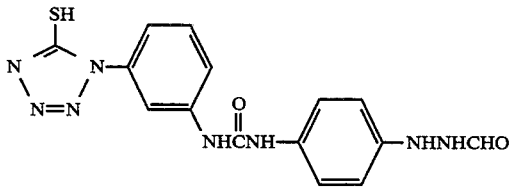 (N-II-13)
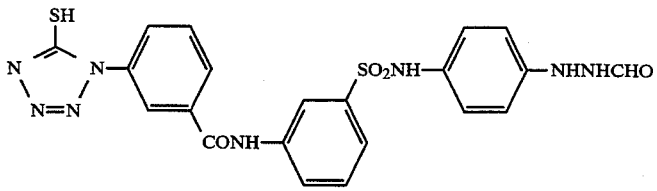 (N-II-14)

-continued
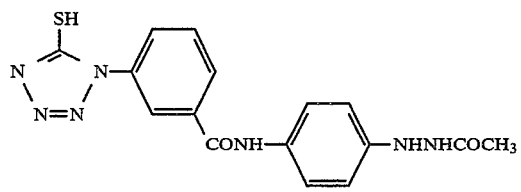
(N-II-15)
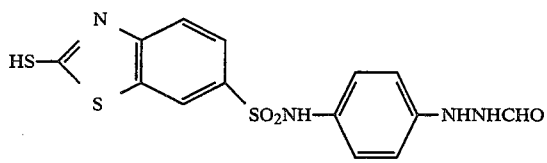
(N-II-16)
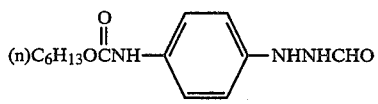
(N-II-17)
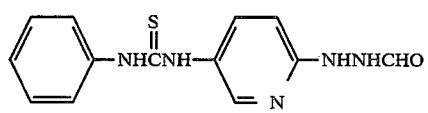
(N-II-18)
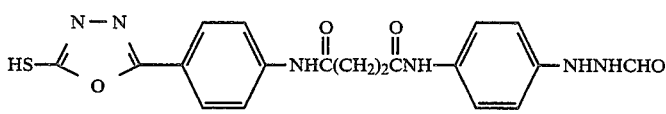
(N-II-19)
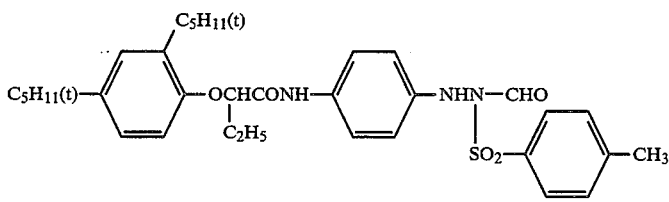
(N-II-20)
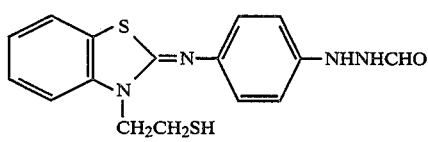
(N-II-21)
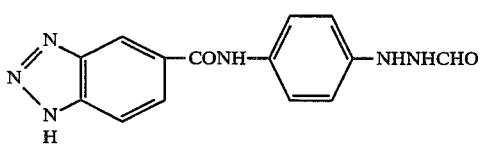
(N-II-22)
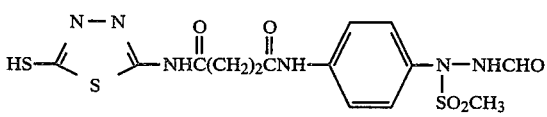
(N-II-23)
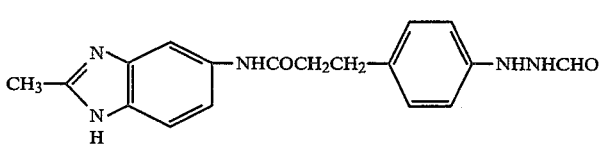
(N-II-24)
For the synthesis of the aforementioned compounds, reference may be made to, for example, the patents cited in Research Disclosure, No. 15162 (November 1976, pages 76–77), No. 22534 (January 1983, pages 50–54) and No. 23510 (November 1983, pages 346–352) as well as U.S. Pat. Nos. 4,080,207, 4,269,924, and 4,276,364.
Any one or more of the compounds of formulae (I) and (II) is contained in any layer of the lithographic printing material, preferably in a silver halide emulsion layer. The amount of the nucleating agent used is not critical although better results are obtained when it is used in an amount of about $1\times10^{-8}$ to $1\times10^{-2}$ mol, especially about $1\times10^{-7}$ to $1\times10^{-3}$ mol per mol of silver in the silver halide emulsion layer. When more than one compound is used, the total amount should preferably fall within this range.

In the practice of the invention, the use of the nucleating agent of formula (I) is preferred. Preferred embodiments are shown below as (I-1) to (I-8), with embodiment (I-8) being most preferred.

(I-1) The compound of formula (I) has a substituent in the form of a radical capable of promoting adsorption to silver halide as represented by $X^1$.

(I-2) In embodiment (I-1), the adsorption promoting radical represented by $X^1$ is a thioamide radical, a heterocyclic mercapto radical, or a nitrogenous heterocyclic radical capable of forming imino silver.

(I-3) In embodiment (I-2), the heterocyclic ring completed by $Z^1$ is a quinolinium, isoquinolinium, naphthopyridinium, or benzothiazolium ring.

(I-4) In embodiment (I-2), the heterocyclic ring completed by $Z^1$ is a quinolinium ring.

(I-5) In embodiment (I-2), $R^1$ or $Z^1$ has a substituent in the form of an alkynyl radical.

(I-6) In embodiment (I-2), $R^1$ is a propargyl radical.

(I-7) In embodiment (I-2), $X^1$ is a thiourethane radical as a typical thioamide radical or a mercaptotetrazole radical as a typical heterocyclic mercapto radical.

(I-8) In embodiment (I-6), $R^1$ is attached to the heterocyclic ring completed by $Z^1$ to form a ring.

Where the nucleating agent of formula (II) is used, preferred embodiments are shown below as (II-1) to (II-6), with embodiment (II-6) being most preferred.

(II-1) The compound of formula (II) has a substituent in the form of a radical capable of promoting adsorption to silver halide as represented by $X^2$.

(II-2) In embodiment (II-1), the adsorption promoting radical represented by $X^2$ is a heterocyclic mercapto radical or a nitrogenous heterocyclic radical capable of forming imino silver.

(II-3) In embodiment (II-2), $G-R^{22}$ represents a formyl radical.

(II-4) In embodiment (II-3), $R^{23}$ and $R^{24}$ are hydrogen atoms.

(II-5) In embodiment (II-3), $R^{21}$ is an aromatic radical.

(II-6) In embodiment (II-2), the heterocyclic mercapto radical represented by $X^2$ is 5-mercaptotetrazole or 5-mercapto-1,2,4-triazole.

In the practice of the invention, a mixture of compounds of formulae (I) and (II) may be used.

The nucleating agents encompass all the compounds which were developed in the photographic art for the purpose of nucleating internal latent image type silver halide. As previously mentioned, two or more nucleating agents may be used in combination. More particularly, the nucleating agents are described in Research Disclosure No. 22534 (January 1983, pages 50–54) and they are generally classified into three classes of hydrazine compounds, quaternary heterocyclic compounds and other compounds.

It will be understood that the nucleating agents of formula (I) belong to the quaternary heterocyclic compound class and the nucleating agents of formula (II) belong to the hydrazine compound class.

The hydrazine compounds are described, for example, in Research Disclosure No. 15162 (November 1976, pages 76–77) and No. 23510 (November 1983, pages 346–352). More specifically, reference should be made to the following patents. Examples of the hydrazine nucleating agent having a silver halide adsorbing radical are described in U.S. Pat. Nos. 4,030,925, 4,080,207, 4,031,127, 3,718,470, 4,269,929, 4,276,364, 4,278,748, 4,385,108, 4,459,347, UK patent No. 2,011,391 B, JP-A 074729/1979, 163533/1980, 074536/1980, and 179734/1985. Other examples of the hydrazine nucleating agent are described in JP-A 086829/1982, and U.S. Pat. Nos. 4,560,638, 4,478, 2,563,785, and 2,588,982.

The quaternary heterocyclic compounds are described, for example, in Research Disclosure No. 22534, JP-B 38164/1974, 19452/1977, 47326/1977, JP-A 069613/1977, 003426/1977, 138742/1980, and 011837/1985, U.S. Pat. No. 4,306,016, and Research Disclosure No. 23213 (August 1983, pages 267–270).

In the practice of the invention, any of the conventional nucleating agents may be used along with the nucleating agents of formulae (I) and (II). Better results are obtained when the nucleating agents of formulae (I) are used.

In the practice of the invention, it is preferred to use a nucleation accelerating agent along with the nucleating agent. The term "nucleation accelerating agent" used herein is a compound which does not have the function of a nucleating agent in a substantial sense, but assists in the action of a nucleating agent for increasing the maximum density of a direct positive image and/or reducing the development time necessary to provide a direct positive image with a desired density.

Useful nucleation accelerating agents are represented by the general formula:

$$A\text{—}[\text{—}(Y^1)_s\text{—}R]_t \qquad (III)$$

In formula (III), A is a radical capable of adsorbing to silver halide; $Y^1$ is a divalent linkage in the form of an atom selected from a hydrogen, carbon, nitrogen, oxygen and sulfur atom or a group of such atoms; R is an organic radical containing a thioether, amino, ammonium, ether or heterocyclic radical; letter s is equal to 0 or 1; and t is equal to 1 or 2.

The radicals adsorbable to silver halide represented by A include compounds having a mercapto radical attached to a heterocyclic ring, heterocyclic compounds capable of forming imino silver, and hydrocarbon compounds having a mercapto radical.

Examples of the mercapto compound attached to a heterocyclic ring include substituted or unsubstituted mercaptoazoles (e.g., 5-mercaptotetrazoles, 3-mercapto-1,2,4-triazoles, 2-mercaptoimidazoles, 2-mercapto-1,3,4-thiadiazoles, 5-mercapto-1,2,4-thiadiazoles, 2-mercapto-1,3,4-oxadiazoles, 2-mercapto-1,3,4-selenadiazoles, 2-mercaptooxazoles, 2-mercaptothiazoles, 2-mercaptobenzoxazoles, 2-mercaptobenzimidazoles, 2-mercaptobenzothiazoles, etc.), and substituted or unsubstituted mercaptopyrimidines (e.g., 2-mercaptopyrimidines).

Examples of the heterocyclic compounds capable of forming imino silver include substituted or unsubstituted indazoles, benzimidazoles, benzotriazoles, benzoxazoles, benzothiazoles, imidazoles, thiazoles, oxazoles, triazoles, tetrazoles, azaindenes, pyrazoles, and indoles.

Examples of the hydrocarbon compounds having a mercapto radical include alkylmercaptans, arylmercaptans, alkenylmercaptans, and aralkylmercaptans.

$Y^1$ is a divalent linkage which is an atom selected from a hydrogen atom, carbon atom, nitrogen atom, oxygen atom, and sulfur atom or a group of such atoms. Useful divalent linkages are shown below.

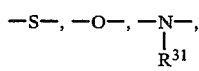

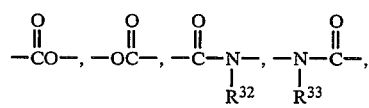

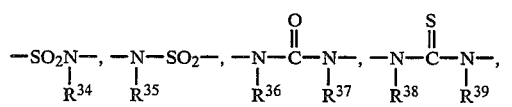

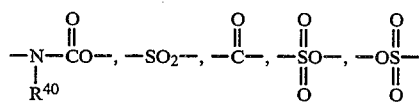

The linkage may be attached to A or a heterocyclic ring to be described later via a linear or branched alkylene radical (e.g., methylene, ethylene, propylene, butylene, hexylene, and 1-methylethylene radicals) or a substituted or unsubstituted arylene radical (e.g., phenylene and naphthylene radicals).

In the linkage formulae, $R^{31}$, $R^{32}$, $R^{33}$, $R^{34}$, $R^{35}$, $R^{36}$, $R^{37}$, $R^{38}$, $R^{39}$, and $R^{40}$ represent hydrogen atoms, substituted or unsubstituted alkyl radicals (e.g., methyl, ethyl, propyl and n-butyl radicals), substituted or unsubstituted aryl radicals (e.g., phenyl and 2-methylphenyl radicals), substituted or unsubstituted alkenyl radicals (e.g., propenyl and 1-methylvinyl radicals), or substituted or unsubstituted alkyl radicals (e.g., benzyl and phenethyl radicals).

R is an organic radical containing at least one member selected from the group consisting of thioether radicals, amino radicals (inclusive of salt form), ammonium radicals, ether radicals and heterocyclic radicals (inclusive of salt form). Typical of the organic radical is a radical selected from substituted or unsubstituted alkyl, alkenyl, aralkyl, and aryl radicals, having incorporated or combined therewith a member selected from the above-mentioned group. Examples include hydrochloride salts of dimethylaminoethyl, aminoethyl, diethylaminoethyl, dibutylaminoethyl, and dimethylaminopropyl radicals; dimethylaminoethylthioethyl, 4-dimethylaminophenyl, 4-dimethylaminobenzyl, methylthioethyl, ethylthiopropyl, 4-methylthio-3-cyanophenyl, methylthiomethyl, trimethylammonioethyl, methoxyethyl, methoxyethoxyethoxyethyl, methoxyethylthioethyl, 3,4-dimethoxyphenyl, 3-chloro-4-methoxyphenyl, morpholinoethyl, 1-imidazolylethyl, morpholinoethylthioethyl, pyrrolidinoethyl, piperidinopropyl, 2-pyridylmethyl, 2-(1-imidazolyl)ethylthioethyl, pyrazolylethyl, triazolylethyl, and methoxyethoxyethoxyethoxycarbonylaminoethyl radicals.

Preferred examples of the compound of formula (III) are given below.

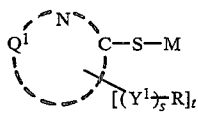

III-i

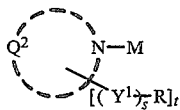

III-ii

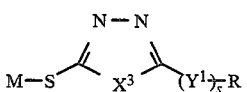

III-iii

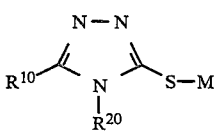

III-iv

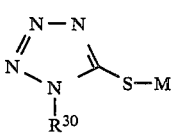

III-v

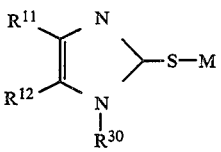

III-vi

In formula (III-i), $Q^1$ is a group of atoms necessary to form a five- or six-membered heterocyclic ring containing at least one atom selected from carbon, nitrogen, oxygen, sulfur and selenium atoms. The heterocyclic ring may have an aromatic carbocyclic ring or heterocyclic aromatic ring fused thereto. Examples of the heterocyclic ring include tetrazoles, triazoles, imidazoles, thiadiazoles, oxadiazoles, selenadiazoles, oxazoles, thiazoles, benzoxazoles, benzothiazoles, benzimidazoles, and pyrimidines.

These heterocyclic rings may have substituents, for example, nitro radicals, halogen atoms (e.g., chlorine and bromine atoms), mercapto radicals, cyano radicals, substituted or unsubstituted alkyl radicals (e.g., methyl, ethyl, propyl, t-butyl, and cyanoethyl radicals), aryl radicals (e.g., phenyl, 4-methanesulfonamidophenyl, 4-methylphenyl, 3,4-dichlorophenyl, and naphthyl radicals), alkenyl radicals (e.g., allyl radical), aralkyl radical (e.g., benzyl, 4-methylbenzyl, and phenethyl radicals), sulfonyl radicals (e.g., methanesulfonyl, ethanesulfonyl and p-toluenesulfonyl radicals), carbamoyl radicals (e.g., unsubstituted carbamoyl, methylcarbmmoyl, and phenylcarbamoyl radicals), sulfamoyl radicals (e.g., unsubstituted sulfamoyl, methylsulfamoyl, and phenylsulfmmoyl radicals), carbonamide radicals (e.g., acetamide and benzamide radicals), sulfonamide radicals (e.g., methanesulfonamide, benzenesulfonamide, and p-toluenesulfonamide radicals), acyloxy radicals (e.g., acetyloxy and benzoyloxy radicals), sulfonyloxy radical (e.g., methanesulfonyloxy radical), ureido radicals (e.g., unsubstituted ureido, methylureido, ethylureido, and phenylureido radicals), thioureido radicals (e.g., unsubstituted thioureido and methylthioureido radicals), acyl radicals (e.g., acetyl and benzoyl radicals), oxycarbonyl radicals (e.g., methoxycarbonyl and phenoxycarbonyl radicals), oxycarbonylamino radicals (e.g., methoxycarbonylamino, phenoxycarbonylamino, and 2-ethylhexyloxycarbonylamino radicals), carboxylic acids or salts thereof, sulfonic acids or salts thereof, and hydroxyl radical. It is preferred for nucleation accelerating effect that the heterocyclic ring be not replaced with a carboxylic acid or salt thereof, a sulfonic acid or salt thereof, and a hydroxyl radical.

Preferred examples of the heterocyclic ring represented by $Q^1$ include tetrazoles, triazoles, imidazoles, thiadiazoles, and oxadiazoles.

M is a hydrogen atom, an alkali metal atom (e.g., sodium and potassium atoms), an ammonium radical (e.g., trimethylammonium and dimethylbenzylammonium radicals), or a radical capable of converting into M=H or an alkali metal atom under alkaline conditions (e.g., acetyl, cyanoethyl, and methanesulfonylethyl radicals).

$Y^1$, R, t and s are as defined for formula (III).

In formula (III-ii), $Y^1$, R, t, s and M are as defined for formulae (III) and (Ill-i). $Q^2$ is a group of atoms necessary to form a five- or six-membered heterocyclic ring capable of forming imino silver, preferably a group of atoms necessary to form a five- or six-membered heterocyclic ring containing an atom selected from carbon, nitrogen, oxygen, sulfur and selenium atoms. The heterocyclic ring may have a carbon aromatic ring or heterocyclic aromatic ring fused thereto. Preferred examples of the heterocyclic ring represented by $Q^2$ include indazoles, benzimidazoles, benzotriazoles, benzoxazoles, benzothiazoles, imidazoles, thiazoles, oxazoles, triazoles, tetrazoles, tetraazaindenes, triazaindenes, diazaindenes, pyrazoles, and indoles.

In formula (III-iii), $Y^1$, R, s and M are as defined for formula (III-i). $X^5$ is an oxygen atom, sulfur atom or selenium atom, with the sulfur atom being preferred.

In formula (III-iv), $R^{10}$ is a hydrogen atom, halogen atom (e.g., chlorine and bromine atoms), nitro radical, mercapto radical, unsubstituted amino radical, substituted or unsubstituted alkyl radical (e.g., methyl and ethyl radicals), alkenyl radical (e.g., propenyl and 1-methylvinyl radicals), aralkyl radical (e.g., benzyl and phenethyl radicals), aryl radical (e.g., phenyl and 2-methylphenyl radicals) or —$(Y^1)_s$—R. $R^{20}$ is a hydrogen atom, unsubstituted amino radical, or —$(Y^1)_s$—R. It is essential that at least one of $R^{10}$ and $R^{20}$ represents —$(Y^1)_s$—R. Where both $R^{10}$ and $R^{20}$ represent —$(Y^1)_s$—R, they may be either identical or different. It is understood that M, $Y^1$, R, and s are as defined for formula (III-i).

In formula (III-v), $R^{30}$ is —$(Y^1)_s$—R. It is understood that M, $Y^1$, R, and s are as defined for formula (III-i).

In formula (III-vi), each of $R^{11}$ and $R^{12}$ is a hydrogen atom, halogen atom (e.g., chlorine and bromine atoms), substituted or unsubstituted amino radical (e.g., unsubstituted amino and methylamino radicals), nitro radical, substituted or unsubstituted alkyl radical (e.g., methyl and ethyl radicals), alkenyl radical (e.g., propenyl and 1-methylvinyl radicals), aralkyl radicals (e.g., benzyl and phenethyl radicals), or aryl radical5 (e.g., phenyl and 2-methylphenyl radicals). It is understood that M and $R^{30}$ are as defined for formula (III-v).

Illustrative, non-limiting examples of the compound of formula (III) are given below.

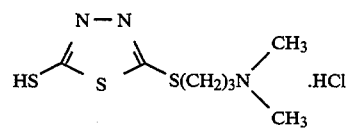
III-1

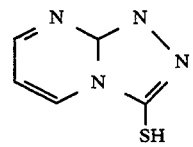
III-2

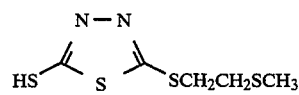
III-3

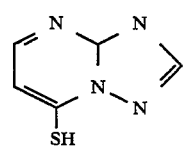
III-4

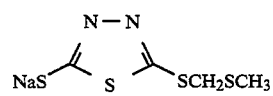
III-5

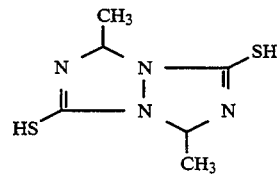
III-6

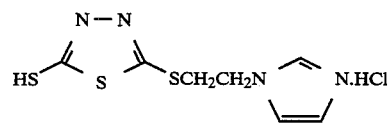
III-7

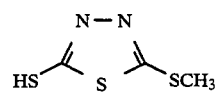
III-8

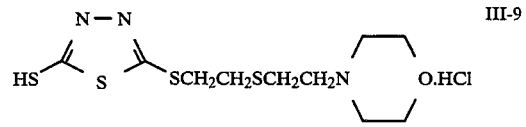
III-9

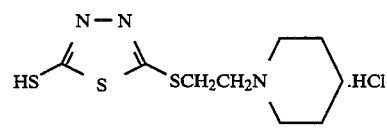
III-10

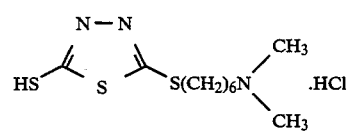
III-11

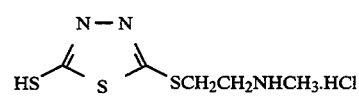
III-12

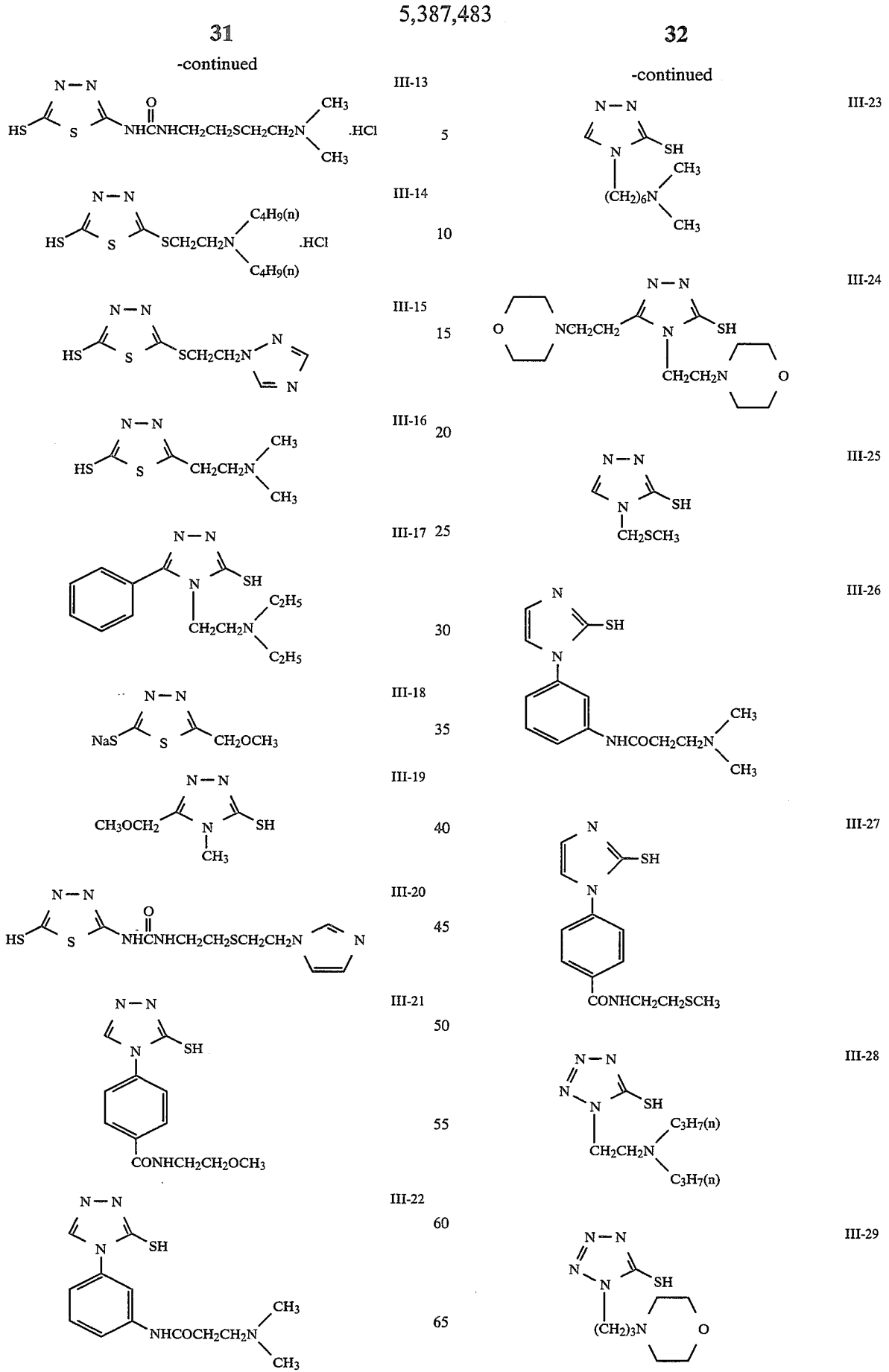

III-30 – III-40 (structures, left column)

Structures III-30 through III-40 are depicted (chemical diagrams).

III-41, III-42 (structures, right column top)

Structures III-41 and III-42 are depicted (chemical diagrams).

The nucleation accelerating agent used herein can be synthesized by the methods described in the following literature and patents.

Berichte der Deutschen Chemischen Gesellshaft, 28, 77 (1895), ibid., 22, 568 (1889), ibid., 29, 2483 (1896), J. Chem. Soc., 1932, 1806, J. Am. Chem. Soc., 71, 4000 (1949), ibid., 45, 2390 (1923), Advances in Heterocyclic Chemistry, 9, 165 (1968), Chemische Berichte, 9, 465 (1876), Organic Synthesis, IV, 569 (1963), U.S. Pat. No. 2,271,229, 2,444,605, 2,444,606, 2,444,607, 2,541,924, 2,585,388, 2,935,404, 3,060,028, 3,071,465, 3,106,467, 3,137,578, 3,148,066, 3,251,691, 3,271,154, 3,295,976, 3,376,310, 3,420,664, 3,420,670, 3,511,663, 3,598,599, 3,615,616,

JP-B 28496/1965, 04135/1968,

JP-A 037436/1975, 089034/1975, 003231/1976,

Japanese Patent Application No. 145932/1987.

The nucleation accelerating agent may be contained in a lithographic printing material or a processing solution, preferably in a lithographic printing material, more preferably in an internal latent image type silver halide emulsion layer or other hydrophilic colloid layers (including intermediate and protective layers). Most preferably, the agent is contained in a silver halide emulsion layer or a layer adjacent thereto.

Preferably the nucleation accelerating agent is added in an amount of $10^{-6}$ to $10^{-2}$ mol, more preferably $10^{-5}$ to $10^{-2}$ mol per mol of silver halide. Where it is added to a processing solution, namely a developer or a preceding bath, its amount is preferably $10^{-8}$ to $10^{-3}$ mol, more preferably $10^{-7}$ to $10^{-4}$ mol per liter of the solution.

To enhance the action of the nucleation accelerating agent, any of the following compounds is preferably used in combination.

Included are hydroquinones (as described in U.S. Pat. No. 3,227,552 and 4,279,987), chromans (as described in U.S. Pat. No. 4,268,621, JP-A 103031/1979, and RD 18264 (1979)), quinones as described in RD 21206 (1981), amines as described in U.S. Pat. No. 4,150,993 and JP-A 174757/1983, oxidizing agents as described in RD 16936 (1978), catechols as described in JP-A 021013/1980 and 065944/1980, compounds capable of releasing nucleating agents upon development as described in JP-A 107029/1985, thioureas as described in JP-A 095533/1985, and spirobisindanes as described in JP-A 065944/1980.

The previously unfogged internal latent image type silver halide emulsion used herein is an emulsion in which silver halide grains are not previously fogged on their surface and a latent image is formed mainly in the grain interior. More particularly, provided that a silver halide emulsion is coated on a transparent support to a predetermined coverage, exposed for a fixed time of 0.01 to 10 seconds, and developed in a developer before the maximum density is measured by conventional photographic densitometry, the emulsion should preferably be such that the maximum density obtained upon development in developer A (internal developer, as defined below) at 20° C. for 6 minutes is at least 5 times, preferably at least 10 times higher than the maximum density obtained upon development in developer B (surface developer, as defined below) at 18° C. for 5 minutes.

| Internal developer A | |
|---|---|
| Metol | 2 g |
| Sodium sulfite (anhydrous) | 90 g |
| Hydroquinone | 8 g |
| Sodium carbonate monohydrate | 52.5 g |
| KBr | 5 g |
| KI | 0.5 g |
| Water totaling to | 1 liter |
| Surface developer B | |
| Metol | 2.5 g |
| L-ascorbic acid | 10 g |
| $NaBO_2.4H_2O$ | 35 g |
| KBr | 1 g |
| Water totaling to | 1 liter |

Illustrative examples of the internal latent image type emulsion include conversion type silver halide emulsions and core/shell type silver halide emulsions as described in UK Patent No. 1,011,062 and U.S. Pat. Nos. 2,592,250 and 2,456,943. The core/shell type silver halide emulsions are described in JP-A 032813/1972, 032814/1972, 134721/1977, 156614/1977, 060222/1978, 066218/1978, 066727/1978, 127549/1980, 136641/1982, 070221/1983, 208540/1984, 216136/1984, 107641/1985, 247237/1985, 002148/1986, and 003137/1986, JP-B 18939/1981, 01412/1983, 01415/1983, 06935/1983, and 108528/1983, Japanese Patent Application No. 36424/1986, U.S. Pat. Nos. 3,206,313, 3,317,322, 3,761,266, 3,761,276, 3,850,637, 3,923,513, 4,035,185, 4,395,478, and 4,504,570, EP 0017148, and Research Disclosure, RD 16345 (November 1977).

Preferred silver halide compositions are previously described.

The silver halide grains preferably have a mean grain size of 0.05 to 2 μm, more preferably from 0.1 to 2 μm, most preferably from 0.15 to 1 μm. For spherical or nearly spherical grains, the mean grain size is an average of the diameters of grains and for cubic grains, it is an average based on the projected areas of grains with the side length being the grain size. The grain size distribution may be either narrow or wide although a commonly known "monodispersed" silver halide emulsion having a narrow grain size distribution that more than 90%, especially more than 95% based on grain number or weight of the entire grains fall within ±40%, more preferably within ±30%, most preferably within ±20% of the mean grain size is preferred for improving graininess and sharpness. To satisfy the designed-for gradation of the lithographic printing material, in emulsion layers having substantially the same color sensitivity, two or more monodispersed silver halide emulsions having different grain sizes or two or more silver halide emulsions containing grains of the same size, but of different sensitivities may be mixed in a single layer or coated as separate layers in an overlapping manner. Alternatively, two or more poly-dispersed silver halide emulsions or a mono-dispersed emulsion and a poly-dispersed emulsion may be mixed or overlapped.

The silver halide grains preferably have cubic or octahedral crystal forms as previously described. Also included are a regular crystal form such as dodecahedron (12-sided) and tetradecahedron (14-sided), an irregular crystal form such as spherical form, and a composite form of these crystal forms. Also plate grains are acceptable, and especially useful are emulsions wherein plate grains having an aspect (length/breadth) ratio of at least 5, especially at least 8 occupy at least 50% of the overall projected areas of grains. Emulsions containing a mixture of different crystal form grains are also useful.

As used herein, the silver halide emulsion may be prepared in the presence of a silver halide solvent. Examples of the silver halide solvent include organic thioethers as described in U.S. Pat. Nos. 3,271,157, 3,531,289, and 3,574,628 and JP-A 001019/1979 and 158917/1979, and thiourea derivatives as described in JP-A 082408/1978, 077737/1980 and 002982/1980. In the preparation of such emulsions, grains may be doped with metals such as It, Rh, Ru, Pd, Pt, Pb and Fe during grain formation. The silver halide emulsion used herein may be chemically sensitized by effecting selenium sensitization, reducing sensitization or noble metal sensitization alone or in combination within or on silver halide grains.

To the lithographic printing material of the invention there may be added sensitizing dyes (e.g., cyanine dyes and merocyanine dyes) for the purpose of increasing sensitivity as described in JP-A 052050/1980, pages 45-53.

The sensitizing dyes may be used alone or in combination of two or more. A combination of sensitizing dyes is frequently used for supersensitization. Along with the sensitizing dye, a dye which itself is free of spectral sensitizing ability or a substance which does not substantially absorb visible light, but contributes to supersensitization may be contained in the emulsion.

Useful sensitizing dyes, dye combinations providing supersensitization and substances contributing to supersensitization are described in the foregoing patents as well as Research Disclosure, Vol. 176, 17643 (December 1978), page 23, items IV-A to J.

It will be understood that the sensitizing dyes or the like may be added at any step of the emulsion preparation process and at any stage after the end of preparation until coating. For example, they may be added at the step of grain formation, physical ripening or chemical ripening.

The sensitizing dye used herein may be selected from orthochromatic sensitizing dyes, panchromatic sensitizing dyes, and infrared sensitizing dyes in accordance with a high illuminance light source selected from conventional tungsten halide lamps and Ar, He-Ne and semiconductor lasers.

Preferred sensitizing dyes are shown below.

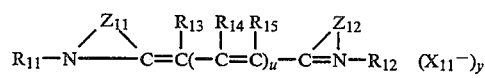

(IV)

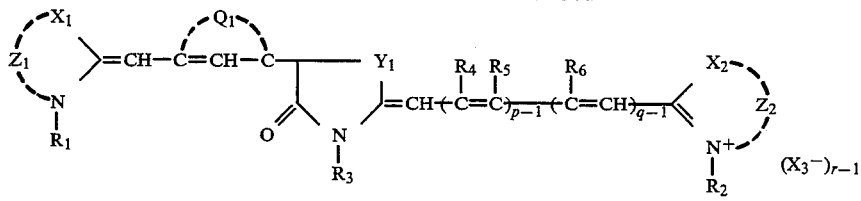

In formula (IV), $Z_{11}$ and $Z_{12}$, which may be identical or different, each represent a group of atoms forming a five or six-membered nitrogeneous heterocyclic ring with the nitrogen and carbon atoms, and letter u is equal to 0 or 1. $R_{11}$ and $R_{12}$, which may be identical or different, each represent a substituted or unsubstituted alkyl or alkenyl radical having up to 10 carbon atoms in total. $R_{13}$ and $R_{15}$ represent hydrogen atoms, or $R_{13}$ and $R_{11}$ taken together and $R_{15}$ and $R_{12}$ taken together may form a five or six-membered ring. $R_{14}$ is a hydrogen atom or a lower alkyl radical which may have a substituent. $X_{11}$ is an acid anion residue. Letter v is equal to 0 or 1. In the case of an internal salt, v is 0.

Preferred heterocyclic rings formed by $Z_{11}$ or $Z_{12}$ are shown below. Where u is equal to 0, $Z_{11}$ and $Z_{12}$ may be identical or different and form heterocyclic rings including thiazole, benzothiazole, naphthothiazole, dihydronaphthothiazole, selenazole, benzoselenazole, naphthoselenazole, dihydronaphthoselenazole, oxazole, benzoxazole, naphthoxazole, benzimidazole, naphthoimidazole, pyridine, quinoline, imidazo[4,5-b]guinoxaline, and 3,3-dialkylindolenine rings. Where u is equal to 1, the preferred heterocyclic rings formed by $Z_{11}$ include thiazoline, thiazole, benzothiazole, selenazoline, selenazole, benzoselenazole, oxazole, benzoxazole, naphthoxazole, imidazole, benzimidazole, naphthoimidazole, and pyrroline rings and the preferred heterocyclic rings formed by $Z_{12}$ include oxazoline, oxazole, benzoxazole, naphthoxazole, thiazoline, selenazoline, pyrroline, benzimidazole, and naphthoimidazole rings.

The nitrogeneous heterocyclic rings formed by $Z_{11}$ or $Z_{12}$ may have one or more substituents. Preferred substituents include lower alkyl radicals which may be branched or which may, in turn, have a substituent (e.g., hydroxy radical, halogen atom, aryl, aryloxy, arylthio, carboxy, alkoxy, alkylthio, and alkoxycarbonyl radical), more preferably alkyl radicals having up to 10 carbon atoms in total, for example, methyl, ethyl, butyl, chloroethyl, 2,2,3,3-tetrafluoropropyl, hydroxyethyl, benzyl, tolylethyl, phenoxyethyl, phenylthioethyl, carboxypropyl, methoxyethyl, ethylthioethyl, and ethoxycarbonylethyl radicals; lower alkoxy radicals which may, in turn, have a substituent (which is the same as the exemplary substituents on the alkyl radicals), more preferably alkoxy radicals having up to 8 carbon atoms in total, for example, methoxy, ethoxy, pentyloxy, ethoxymethoxy, methylthioethoxy, phenoxyethoxy, hydroxyethoxy, and chloropropoxy radicals; a hydroxy radical; halogen atoms; a cyano radical; aryl radicals, for example, phenyl, tolyl, anisil, chlorophenyl and carboxyphenyl radicals; aryloxy radicals, for example, tolyloxy, anisiloxy, phenoxy and chlorophenoxy radicals; arylthio radicals, for example, tolylthio, chlorophenylthio and phenylthio radicals; lower alkylthio radicals which may, in turn, have a substituent (which is the same as the exemplary substituents on the alkyl radicals), more preferably alkylthio radicals having up to 8 carbon atoms in total, for example, methylthio, ethylthio, hydroxyethylthio, carboxyethylthio, chloroethylthio and benzylthio radicals; acylamino and sulfonylamino radicals, more preferably acylamino radicals having up to 8 carbon atoms in total, for example, acetylamino, benzoylamino, methanesulfonylamino and benzenesulfonylamino radicals; a carboxy radical; lower alkoxycarbonyl radicals, more preferably alkoxycarbonyl radicals having up to 6 carbon atoms in total, for example, ethoxycarbonyl and butoxycarbonyl radicals; perfluoroalkyl radicals, more preferably perfluoroalkyl radicals having up to 5 carbon atoms in total, for example, trifluoromethyl and difluoromethyl radicals; and acyl radicals, more preferably acyl radicals having up to 8 carbon atoms in total, for example, acetyl, propionyl, benzoyl and benzenesulfonyl radicals.

Examples of the nitrogeneous heterocyclic ring formed by $Z_{11}$ or $Z_{12}$ include thiazoline, 4-methylthiazoline, thiazole, 4-methylthiazole, 4,5-dimethylthiazole, 4-phenylthiazole, benzothiazole, 5-methylbenzothiazole, 6-methylbenzothiazole, 5-ethylbenzothiazole, 5,6-dimethylbenzothiazole, 5-methoxybenzothiazole, 6-methoxybenzothiazole, 5-butoxybenzothiazole, 5,6-dimethoxybenzothiazole, 5-methoxy-6-methylbenzothiazole, 5-chlorobenzothiazole, 5-chloro-6-methylbenzothiazole, 5-phenylbenzothiazole, 5-acetylaminobenzothiazole, 6-propionylaminobenzothiazole, 5-hydroxybenzothiazole, 5-hydroxy-6-methylbenzothiazole, 5-ethoxycarbonylbenzothiazole, 5-carboxybenzothiazole, naphtho[1,2-d]thiazole, naphtho[2,1-d]thiazole, 5-methylnaphtho[1,2-d]thiazole, 8-methoxynaphtho[1,2-d]thiazole, 8,9-dihydronaphthothiazole, 3,3-diethylindolenine, 3,3-dipropylindolenine, 3,3-dimethylindolenine, 3,3,5-trimethylindolenine, selenazoline, selenazole, benzoselenazole, 5-methylbenzoselenazole, 6-methylbenzoselenazole, 5-methoxybenzoselenazole, 6-methoxybenzoselenazole, 5-chlorobenzoselenazole, 5,6-dimethylbenzoselenazole, 5-hydroxybenzoselenazole, 5-hydroxy-6-methylbenzoselenazole, 5,6-dimethoxybenzoselenazole, 5-ethoxycarbonylbenzoselenazole, naphtho[1,2-d]selenazole, naphtho[2,1-d]selenazole, oxazole, 4-methyloxazole, 4,5-dimethyloxazole, 4-phenyloxazole, benzoxazole, 5-hydroxybenzoxazole, 5-methoxybenzoxazole, 5-phenylbenzoxazole, 5-phenethylbenzoxazole, 5-phenoxybenzoxazole, 5-chlorobenzoxazole, 5-chloro-6-methylbenzoxazole, 5-phenylthiobenzoxazole, 6-ethoxy-5-hydroxybenzoxazole, 6-methoxybenzoxazole, naphtho[1,2-d]oxazole, naphtho[2,1-d]oxazole, naphtho[2,3-d]oxazole, 1-ethyl-5-cyanobenzimidazole, 1-ethyl-5-chlorobenzimidazole, 1-ethyl-5,6-dichlorobenzimidazole, 1-ethyl-6-chloro-5-cyanobenzimidazole, 1-ethyl-6-chloro-5-trifluoromethylbenzimidazole, 1-propyl-5-butoxycarbonylbenzimidazole, 1-benzyl-5-methylsulfonylbenzimidazole, 1-allyl-5-chloro-6-acetylbenzimidazole, 1-ethylnaphtho[1,2-d]imidazole, 1-ethyl-6-chloronaphtho[2,3-d]imidazole, 2-quinoline, 4-quinoline, 8-fluoro-4-quinoline, 6-methyl-2-quinoline, 6-hydroxy-2-quinoline, and 6-methoxy-2-quinoline.

$R_{11}$ and $R_{12}$, which may be identical or different, each represent a substituted or unsubstituted alkyl or alkenyl radical having up to 10 carbon atoms in total. Preferred substituents on the alkyl and alkenyl radicals include sulfo, carbonyl, halogen atom, hydroxy, alkoxy radicals having up to 6 carbon atoms, substituted or unsubstituted aryl radicals having up to 8 carbon atoms (e.g., phenyl, tolyl, sulfophenyl and carboxyphenyl radicals), heterocyclic radicals (e.g., furyl and thienyl radicals), substituted or unsubstituted aryloxy radicals having up to 8 carbon atoms (e.g., chlorophenoxy, phenoxy, sulfophenoxy and hydroxyphenoxy radicals), acyl radicals having up to 8 carbon atoms (e.g., benzenesulfonyl, methanesulfonyl, acetyl and propionyl radicals), alkoxycarbonyl radicals having up to 6 carbon atoms (e.g., ethoxycarbonyl and butoxycarbonyl radicals), cyano radicals, substituted or unsubstituted alkylthio radicals having up to 6 carbon atoms (e.g., methylthio and ethylthio radicals), substituted or unsubstituted arylthio radicals having up to 8 carbon atoms (e.g., phenylthio and tolylthio radicals), substituted or unsubstituted carbamoyl radicals having up to 8 carbon atoms (e.g., carbamoyl and N-ethylcarbamoyl radicals), and acylamino radicals having up to 8 carbon atoms (e.g., acetylamino and methanesulfonylamino radicals). When substituted, these radicals may have one or more substituents.

Examples of the radical represented by $R_{11}$ and $R_{12}$ include methyl, ethyl, propyl, allyl, pentyl, hexyl, methoxyethyl, ethoxyethyl, phenethyl, tolylethyl, sulfophenethyl, 2,2,2-trifluoroethyl, 2,2,3,3-tetrafluoropropyl, carbamoylethyl, hydroxyethyl, 2-(2-hydroxyethoxy)ethyl, carboxymethyl, carboxyethyl, ethoxycarbonylmethyl, sulfoethyl, 2-chloro-3-sulfopropyl, 3-sulfopropyl, 2-hydroxy-3-sulfopropyl, 3-sulfobutyl, 4-sulfobutyl, 2-(2,3-dihydroxypropyloxy)ethyl, and 2-[2-(3-sulfopropyloxy)ethoxy]ethyl radicals.

Each of $R_{13}$ and $R_{15}$ represents a hydrogen atom, or $R_{13}$ and $R_{11}$ taken together and $R_{15}$ and $R_{12}$ taken together may form a positive or six-membered ring.

$R_{14}$ is a hydrogen atom or a lower alkyl radical which may have a substituent, for example, methyl, ethyl, propyl, methoxyethyl, and phenethyl radicals, with alkyl radicals having up to 5 carbon atoms being preferred.

$X_{11}$ is an acid anion residue, for example, a chloride ion, bromide ion, iodide ion, perchlorate ion, rhodanate ion and p-toluenesulfonate ion.

Letter v is equal to 0 or 1, and v=0 in the case of an internal salt.

Preferred among the sensitizing dyes of formula (IV) are those dyes of the formula wherein u is 1, $Z_{11}$ is a group of atoms forming a heterocyclic ring such as oxazole, benzoxazole, and naphthoxazole, $Z_{12}$ is a group of atoms forming a heterocyclic ring such as benzimidazole and naphthoimidazole, at least one of $R_{11}$ and $R_{12}$ is a radical having a sulfo, carboxy or hydroxy radical, and $R_{14}$ is a hydrogen atom. As previously described, the heterocyclic nucleus represented by each of $Z_{11}$ and $Z_{12}$ may have one or more substituents thereon which are preferably electron attracting substituents when $Z_{12}$ forms a benzimidazole or naphthoimidazole nucleus.

More preferred among the sensitizing dyes of formula (IV) are those dyes of the formula wherein u is 1, $Z_{11}$ is a group of atoms forming a benzoxazole nucleus, $Z_{12}$ is a group of atoms forming a benzimidazole nucleus, at least one of $R_{11}$ and $R_{12}$ is a radical having a sulfo or carboxy radical, and $R_{14}$ is a hydrogen atom. As previously described, the heterocyclic nucleus represented by each of $Z_{11}$ and $Z_{12}$ may have one or more substituents thereon. For the benzimidazole nucleus, such substituents are preferably selected from a chlorine atom, fluorine atom, cyano radical, alkoxycarbonyl radicals having up to 5 carbon atoms in total, acyl radicals having up to 7 carbon atoms in total, and perfluoroalkyl radicals having up to 4 carbon atoms (e.g., trifluoromethyl radical). For the other heterocyclic nuclei, such substituents are preferably selected from substituted or unsubstituted phenyl radicals having up to 8 carbon atoms, alkyl radicals having up to 5 carbon atoms, alkoxy radicals having up to 5 carbon atoms, acylamino radicals having up to 5 carbon atoms in total, carboxy radicals, alkoxycarbonyl radicals having up to 5 carbon atoms in total, benzyl radical, phenethyl radical, and chlorine atom.

Illustrative, non-limiting examples of the compound of formula (IV) are given below.

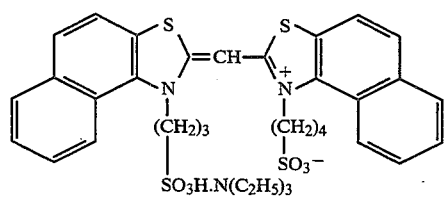

IV-1

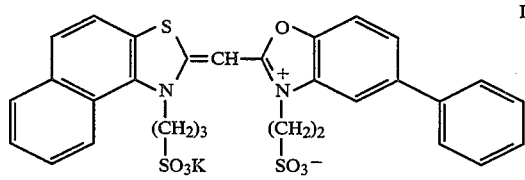

IV-2

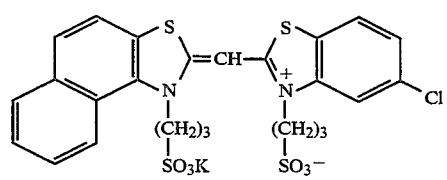

IV-3

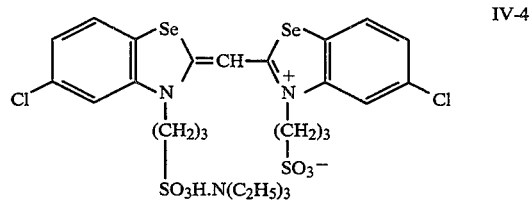

IV-4

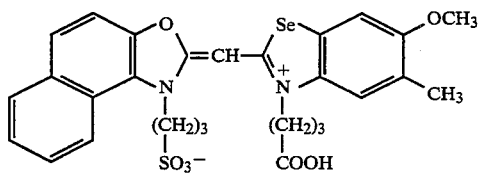
IV-5
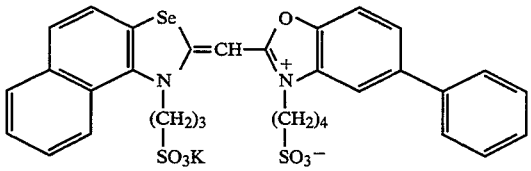
IV-6
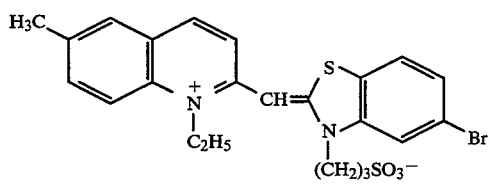
IV-7
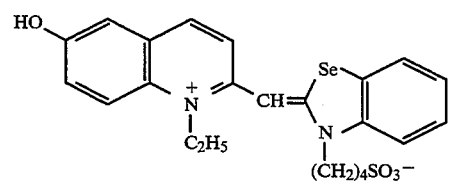
IV-8
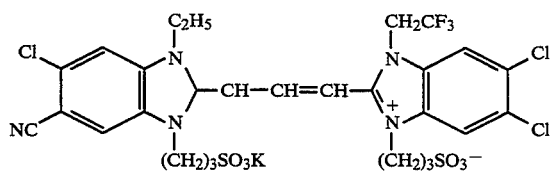
IV-9
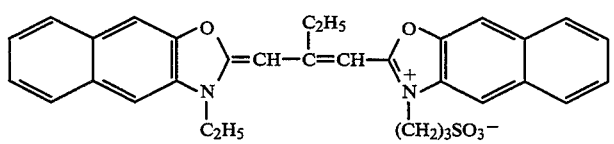
IV-10
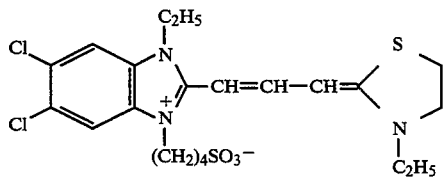
IV-11
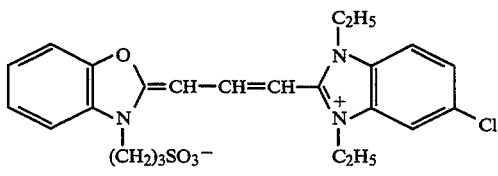
IV-12
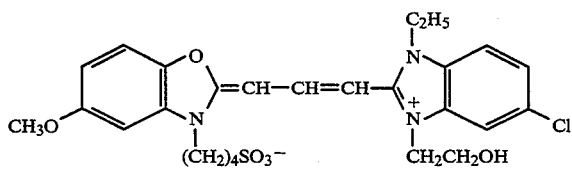
IV-13
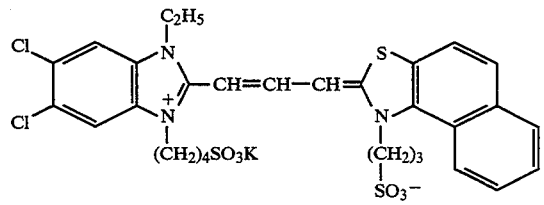
IV-14
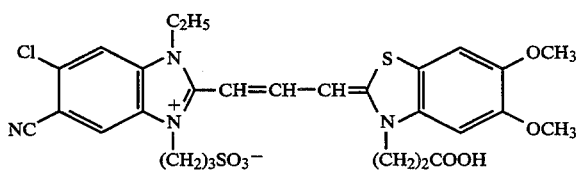
IV-15
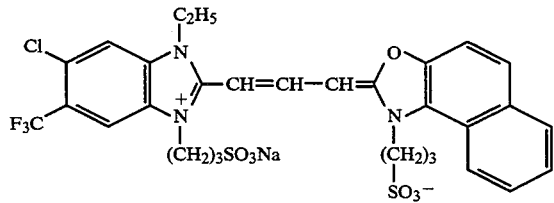
IV-16

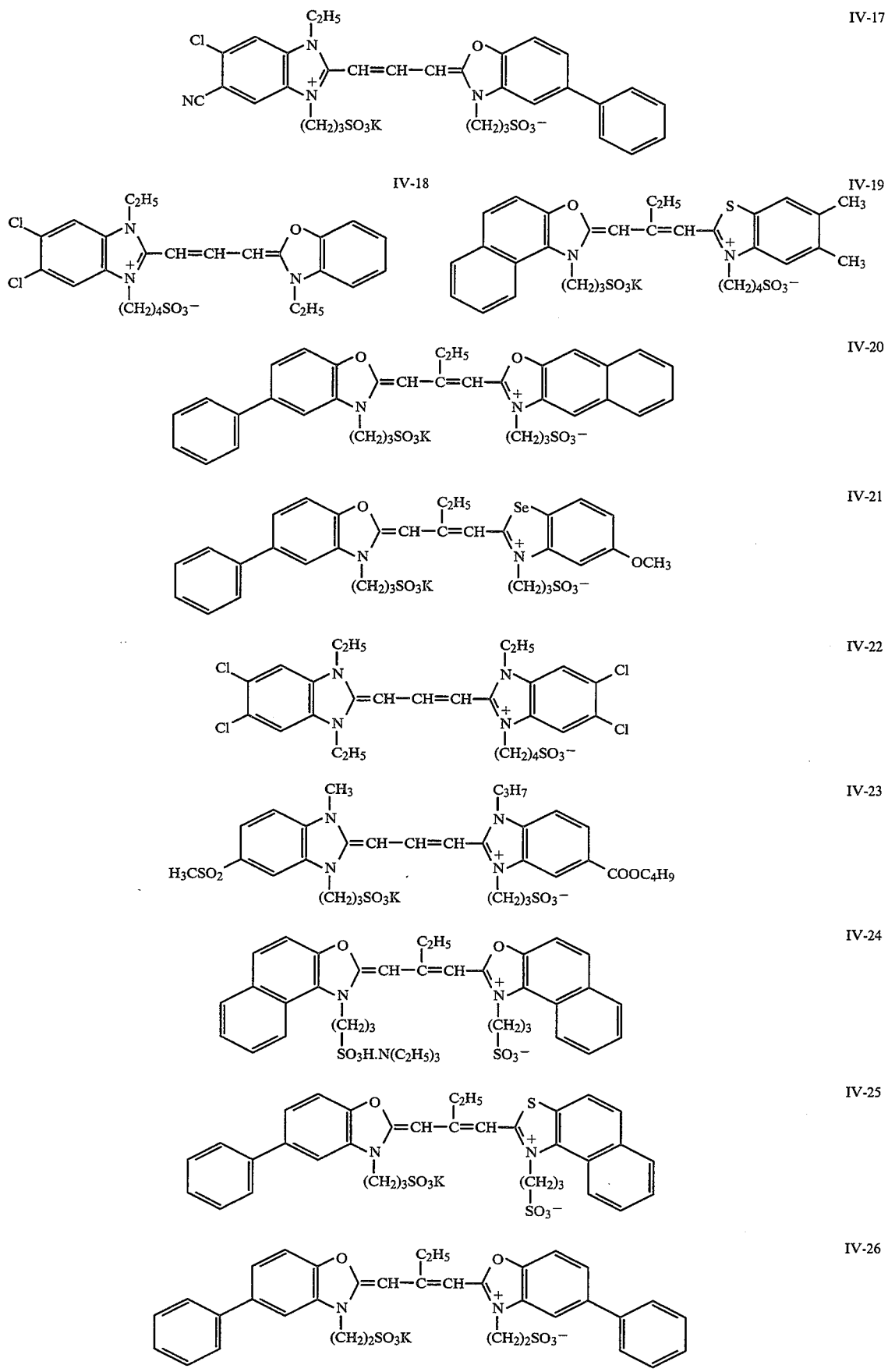

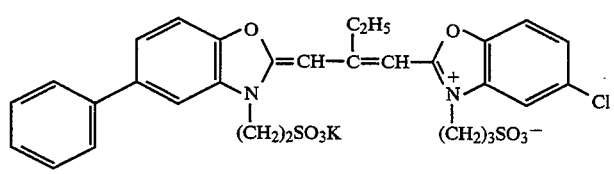
IV-27
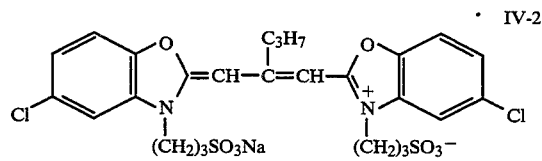
IV-28
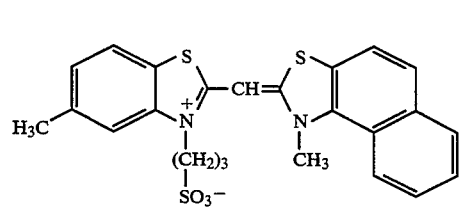
IV-29
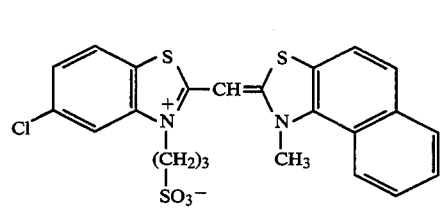
IV-30
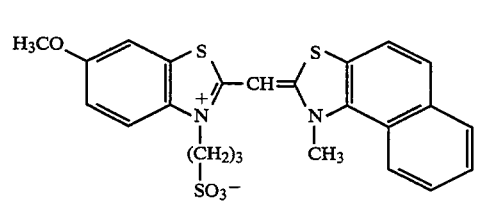
IV-31
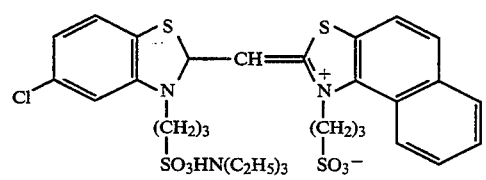
IV-32
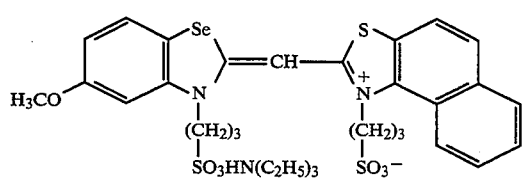
IV-33
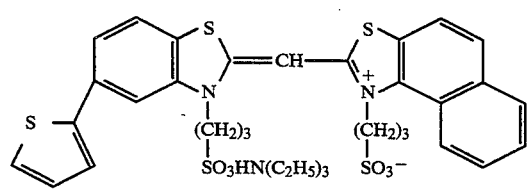
IV-34
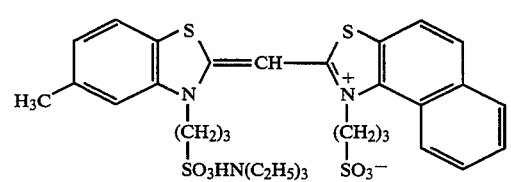
IV-35
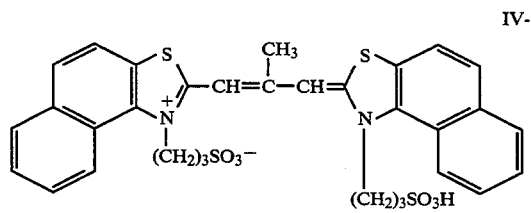
IV-36
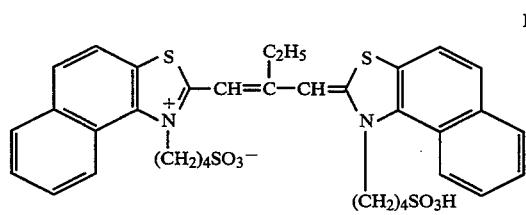
IV-37
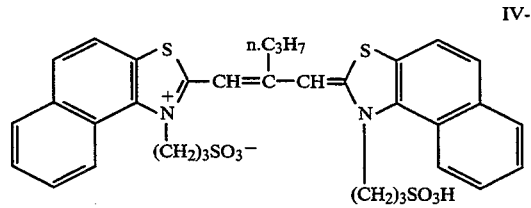
IV-38
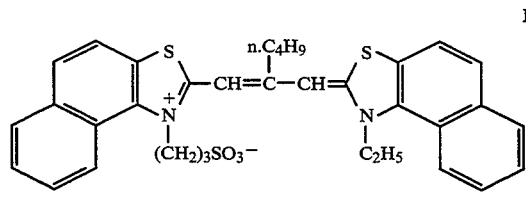
IV-39

-continued
IV-40
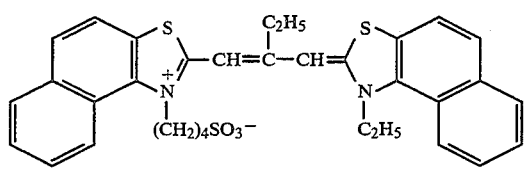
IV-41
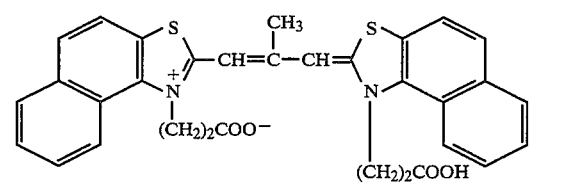
IV-42
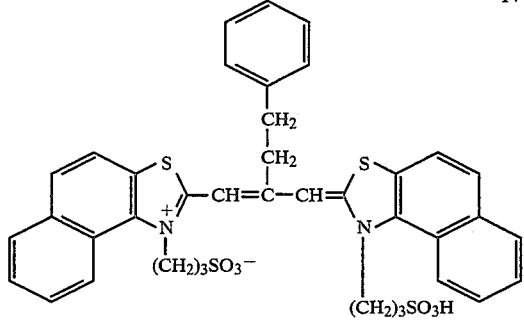
IV-43
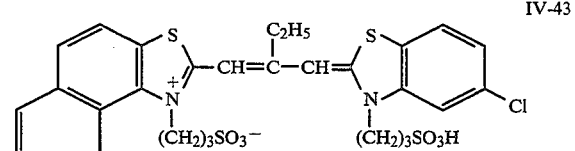
IV-44
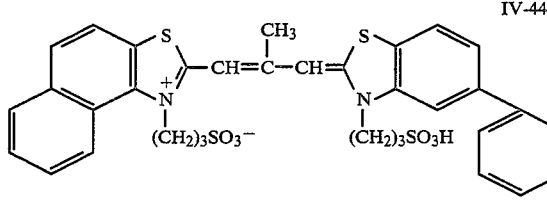
IV-45
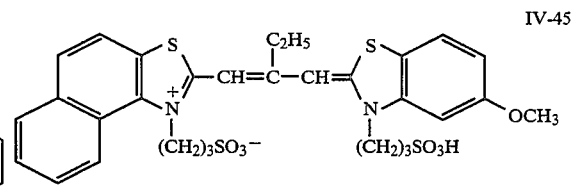
IV-46
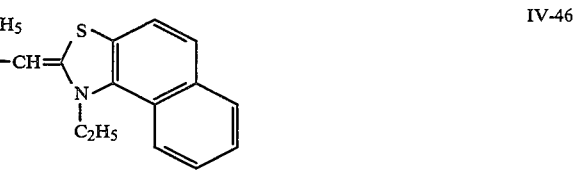
IV-47
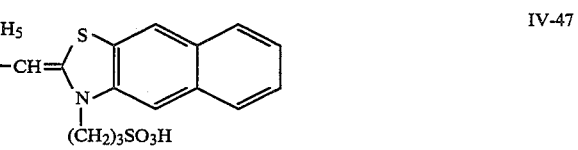
IV-48
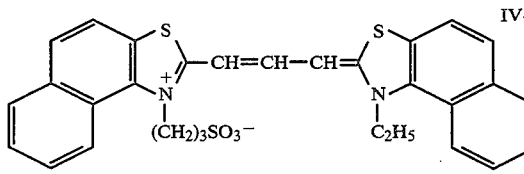
IV-49
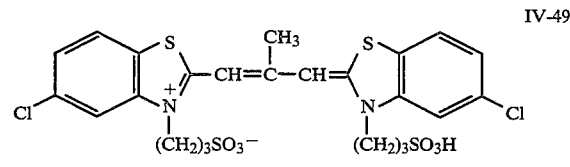
IV-50
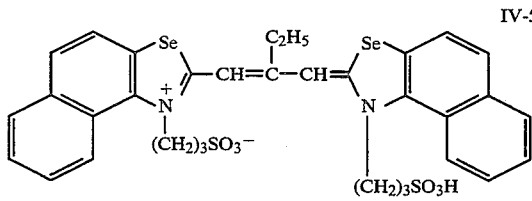
IV-51
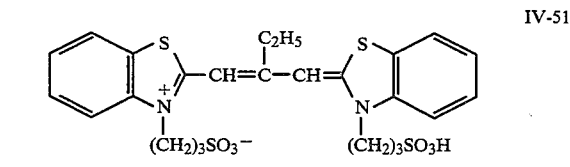
IV-52
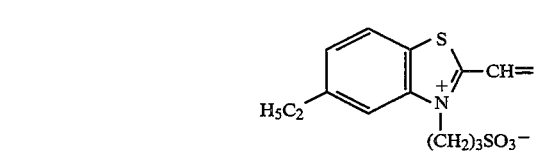

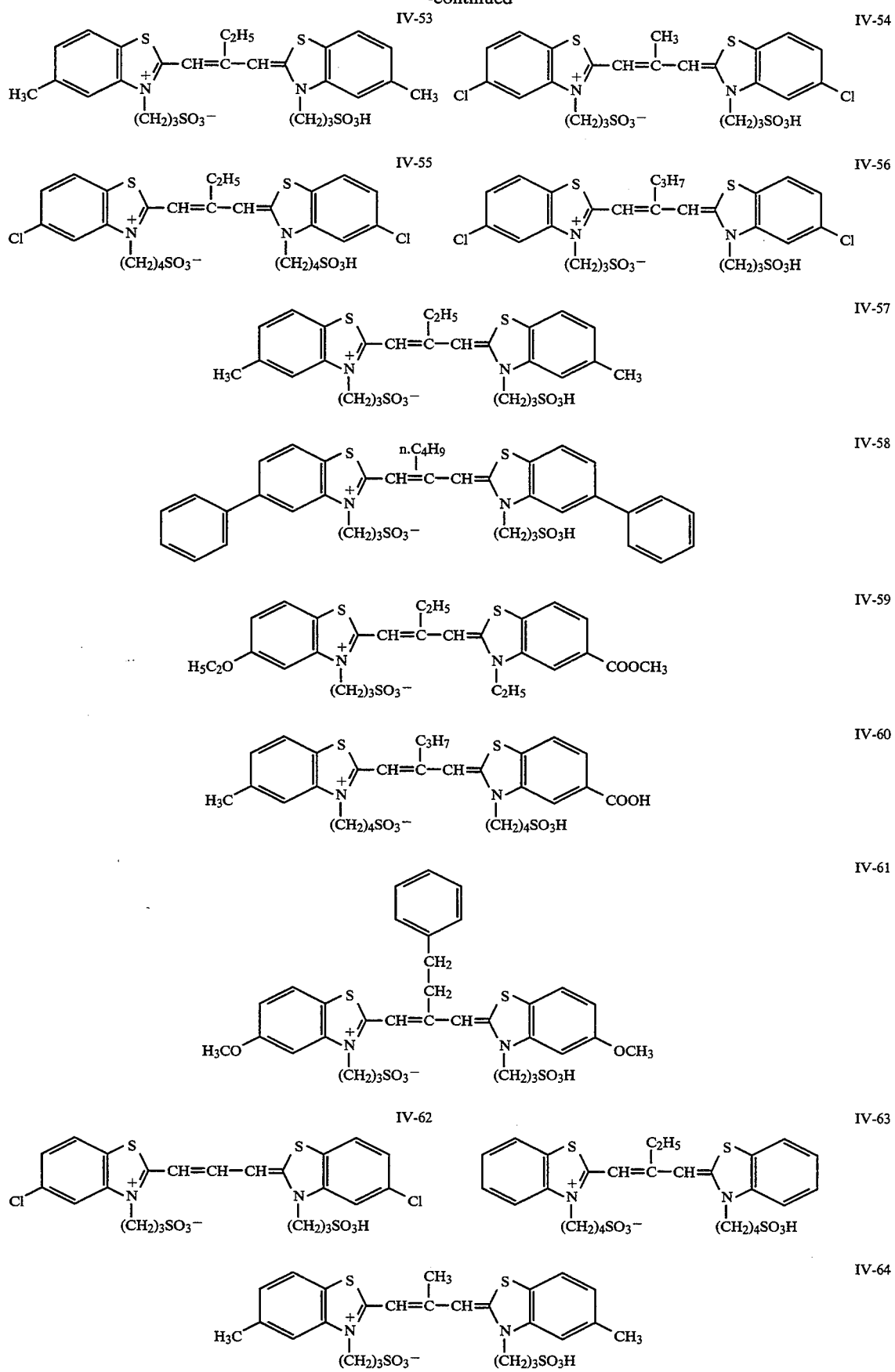

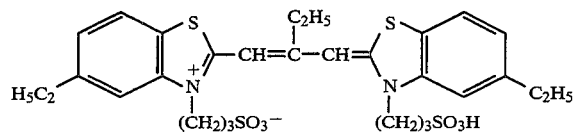 IV-65

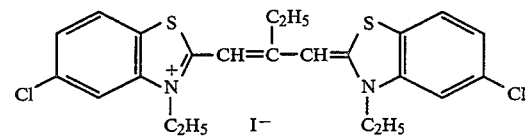 IV-66

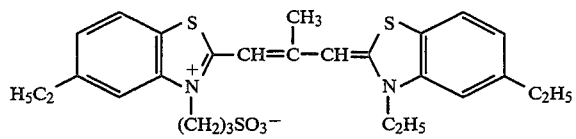 IV-67

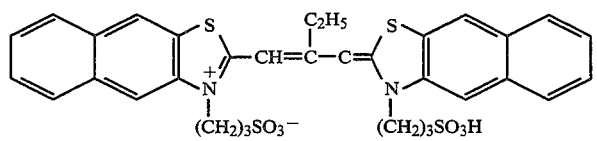 IV-68

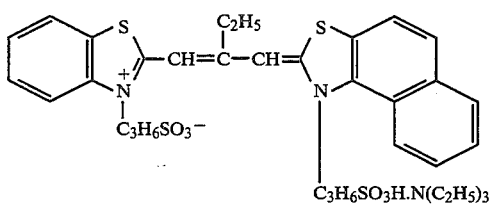 IV-69

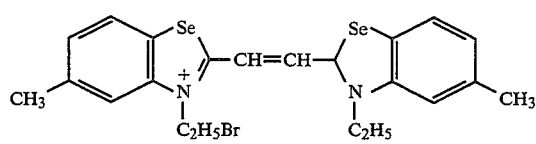 IV-70

In formula (V), $X_1$ and $X_2$, which may be identical or different, each represent an oxygen atom, sulfur atom, selenium atom, a radical of the formula: >N—$R_7$ wherein $R_7$ is an alkyl radical or a radical of the formula:

wherein $R_8$ and $R_9$ are alkyl radicals. $Z_1$ and $Z_2$, which may be identical or different, each represent a group of atoms necessary to form a five-membered nitrogenous heterocyclic ring. $R_1$ and $R_2$, which may be identical or different, each represent an alkyl or alkenyl radical. $R_3$ is an alkyl, alkenyl or aryl radical. $R_4$, $R_5$ and $R_6$, which may be identical or different, each represent a hydrogen atom, halogen atom, alkyl radical or aryl radical. $Y_1$ represents a sulfur atom, an oxygen atom or a radical of the formula: >N—$R_{10}$ wherein $R_{10}$ is an alkyl radical. $Q_1$ is a group of atoms necessary to form a five or six-membered ring by connecting to the carbon atoms of the methylene linkage. $X_3$ is an acid anion. Letters p, q and r each are equal to 1 or 2.

Examples of the nitrogenous heterocyclic ring formed by $Z_1$ or $Z_2$ include thiazole, benzothiazole, naphtho[1,2-d]thiazole, naphtho [2,1-d]thiazole, naphtho [2,3-d]thiazole, selenazole, benzoselenazole, naphtho [2,1-d]selenazole, naphtho [1,2 -d]selenazole, oxazole, benzoxazole, naphtho[1,2 d]oxazole, [2, 1-d]oxazole, naphtho [2,3 -d]oxazole, 3,3 -dialkylindolenine, imidazole, benzimidazole, and naphtho[1,2-d]imidazole.

These heterocyclic rings may have one or more substituents, for example, alkyl radicals (e.g., methyl, ethyl, butyl and trifluoromethyl radicals), aryl radicals (e.g., phenyl and tolyl radicals), hydroxy radicals, alkoxy radicals (e.g., methoxy, ethoxy, and butoxy radicals), carboxy radicals, alkoxycarbonyl radicals (e.g., methoxycarbonyl and ethoxycarbonyl radicals), halogen atoms (e.g., fluorine, chlorine, bromine and iodine), aralkyl radicals (e.g., benzyl and phenethyl radicals), cyano radical, and alkenyl radicals (e.g., allyl radicals).

Examples of the alkyl radical represented by $R_1$ and $R_2$ include lower alkyl radicals such as methyl, ethyl, propyl and butyl; hydroxyalkyl radicals such as β-hydroxyethyl and γ-hydroxypropyl; alkoxyalkyl radicals such as β-methoxyethyl and γ-methoxypropyl; acyloxyalkyl radicals such as β-acetoxyethyl, γ-acetoxypropyl and β-benzoyloxyethyl; carboxyalkyl radicals such as carboxymethyl and β-carboxyethyl; alkoxycarbonylalkyl radicals such as methoxycarbonylmethyl, ethoxycarbonylethyl and β-ethorycarbonylethyl; sulfoalkyl radicals such as β-sulfoethyl, γ-sulfopropyl and δ-sulfobutyl; and aralkyl radicals such as benzyl, phenethyl and sulfobenzyl. An exemplary alkenyl radical is an allyl radical.

Exemplary radicals represented by $R_3$ are alkyl and alkenyl radicals as described just above for $R_1$ and $R_2$ as well as aryl radicals such as phenyl, tolyl, methoxyphenyl, chlorophenyl and naphthyl radicals.

$R_4$ to $R_6$ represent hydrogen atoms, alkyl and aryl radicals as described just above, and halogen atoms such as fluorine, chlorine, bromine and iodine. The alkyl radicals represented by $R_7$ to $R_{10}$ are preferably lower alkyl radicals such as methyl and ethyl. The ring represented by Q₁ may have a lower alkyl substituent such as methyl.

X₃ is an acid anion, for example, an alkyl sulfate ion (e.g., methyl sulfate and ethyl sulfate), thiocyanate ion, toluenesulfonate ion, a halogen ion (e.g., a chloride, bromide, and iodide ion), and a perchlorate ion, but is absent where the dye has a betain analogous structure.

Illustrative, non-limiting examples of the sensitizing dye of formula (V) are given below.

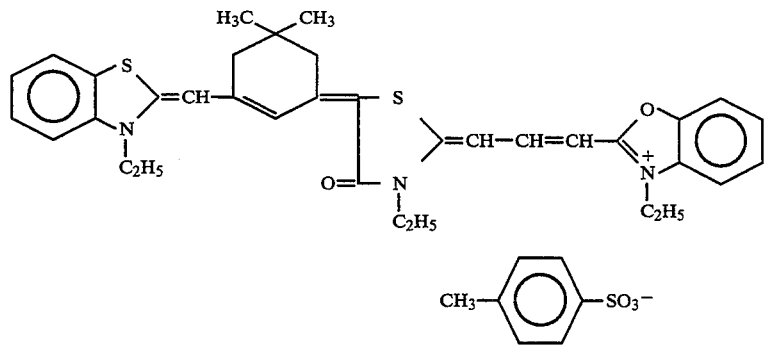
V-1

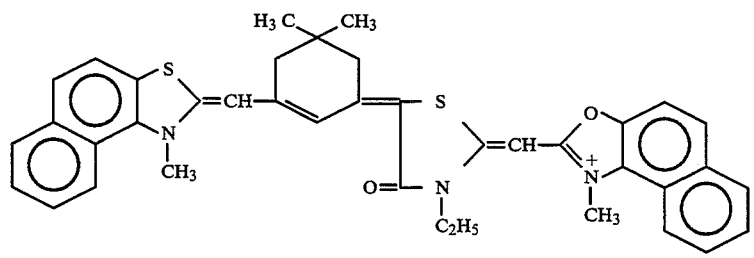
V-2

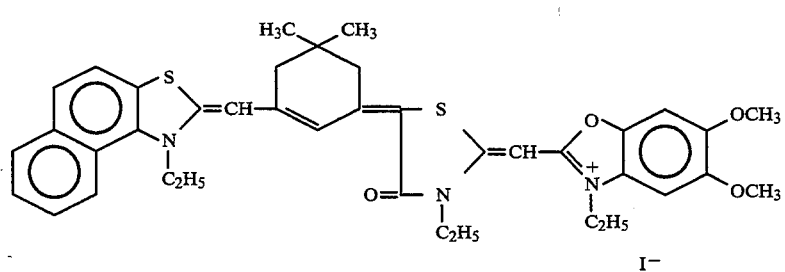
V-3

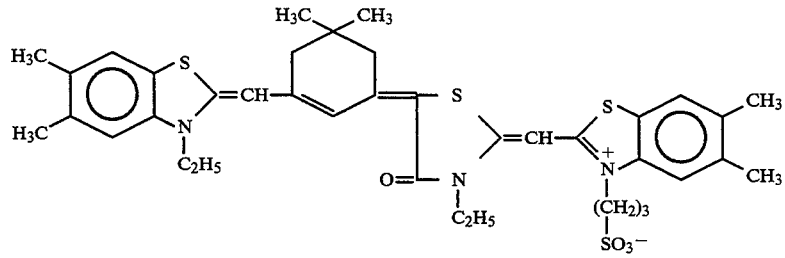
V-4

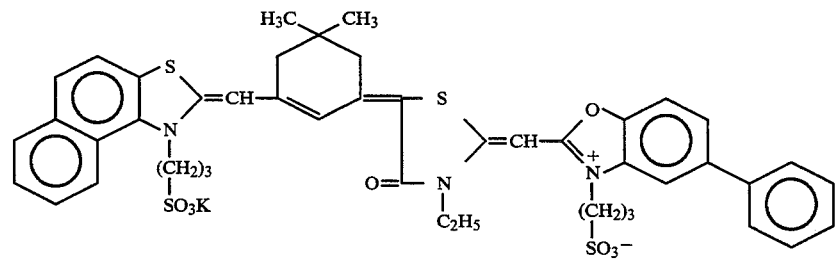
V-5

V-6
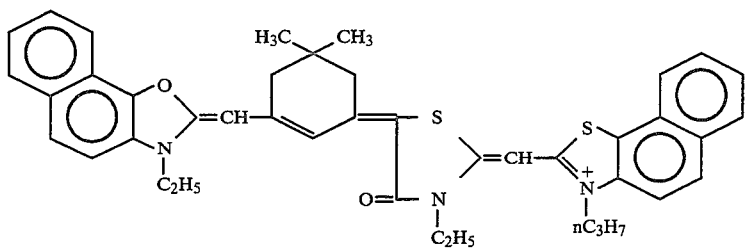
V-7
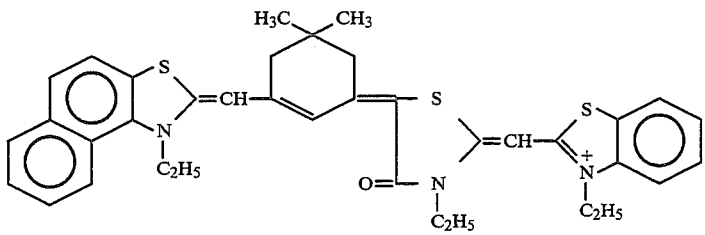
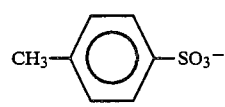
V-8
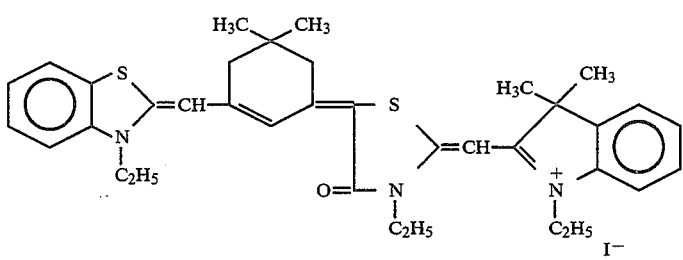
V-9
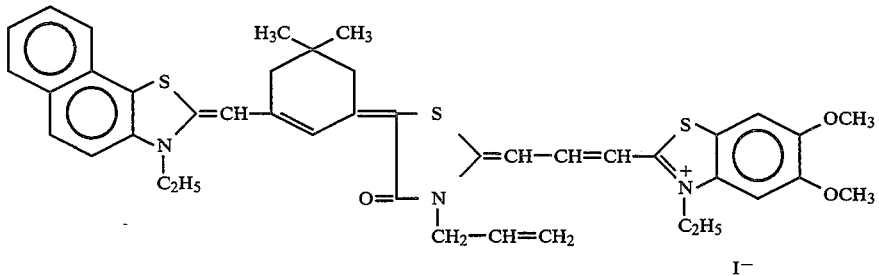
V-10
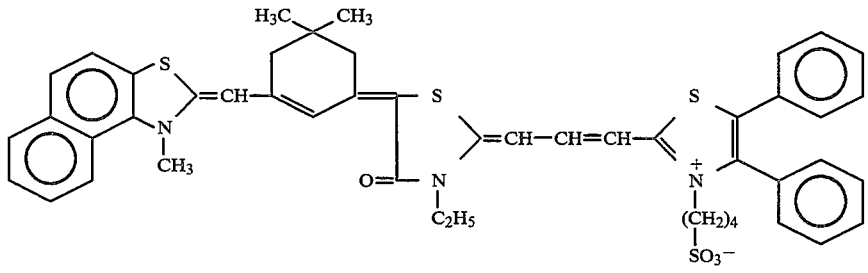
V-11
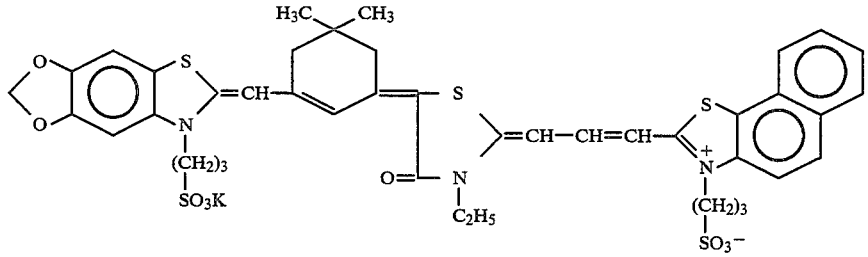

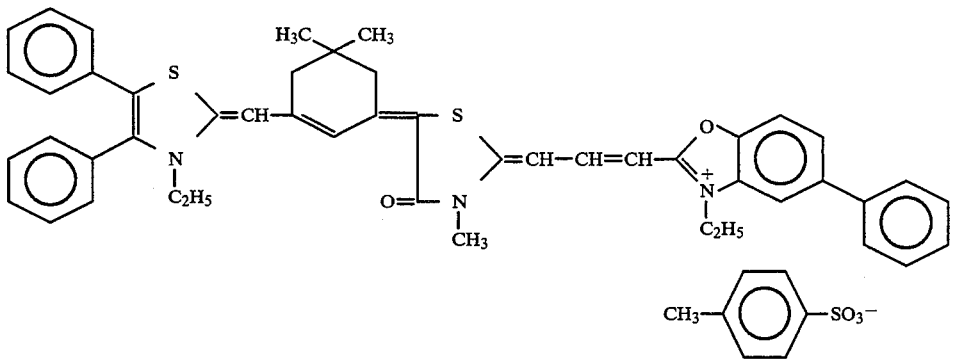

V-12

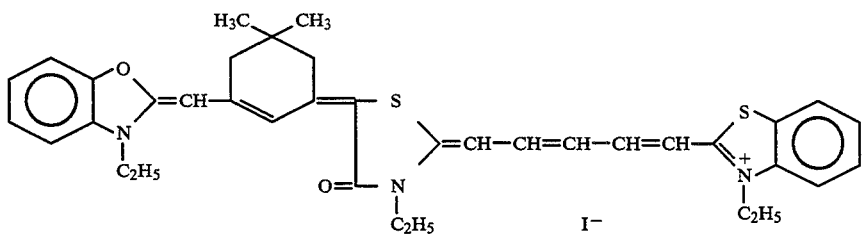

V-13

The sensitizing dyes used herein may be synthesized by commonly known techniques. The sensitizing dye may be added to a silver halide emulsion at any stage before the emulsion is coated. The sensitizing dye may be added in a varying amount although the preferred amount is from $1\times10^{-5}$ to $1\times10^{-2}$ mol per mol of silver halide. The optimum amount of the sensitizing dye added varies with conditions of the silver halide emulsion including the halogen composition, the mean grain size and crystal habit of silver halide grains and the like.

In the emulsion layer or another hydrophilic colloidal layer, water-soluble dyes may be contained as the filter dye or for anti-irradiation or other purposes. Preferred filter dyes are dyes for further reducing photographic sensitivity and dyes having substantial light absorption in the range of 330 to 800 nm for increasing safety against safe light. In accordance with their purpose, these dyes are added with mordants to an emulsion layer or above a silver halide emulsion layer, that is, a non-photosensitive hydrophilic colloid layer disposed remote from the silver halide emulsion with respect to the support in a fixed manner. They are generally added in amounts of $10^{-2}$ g/m² to 1 g/m², preferably 50 mg/m² to 500 mg/m² depending on the molar extinction coefficient thereof. Exemplary dyes are described in JP-A 064039/1988.

In the practice of the invention, various other compounds can be added to lithographic printing material for the purposes of preventing fogging and stabilizing photographic performance during preparation, storage or processing of the lithographic printing material. Such additives include azoles, for example, benzothiazolium salts, nitroindazoles, chlorobenzimidazoles, bromobenzimidazoles, mercaptothiazoles, mercaptobenzothiazoles, mercaptothiadiazoles, aminotriazoles, benzothiazoles, and nitrobenzotriazoles; mercaptopyrimidines; mercaptotriazines; thioketo compounds such as oxazolinethion; azaindenes such as triazaindenes, tetraazaindenes (e.g., 4-hydroxy substituted (1,3,3a,7)tetraazaindenes), and pentaazaindenes; benzenethiosulfonic acid, benzenesulfinic acid, and benzenesulfonic amide, which are known as antifoggants or stabilizers.

The lithographic printing material of the invention includes an emulsion layer to which may be added an agent for providing increased sensitivity, increased contrast, or accelerated development. Such agents include polyalkylene oxides or derivatives thereof such as ethers, esters and amines, thioether compounds, thiomorpholine compounds, quaternary ammonium salt compounds, urethane derivatives, urea derivatives, imidazole derivatives, and developing agents such as dihydroxybenzenes and 3-pyrazolidones. Preferred among others are dihydroxybenzenes such as hydroquinone, 2-methylhydroquinone and catechol and 3-pyrazolidones such as 1-phenyl-3-pyrazolidone and 1-phenyl-4-methyl-4-hydroxymethyl-3-pyrazolidone. They are generally used in a coverage of less than 5 g/m². Preferably the dihydroxybenzenes are used in a coverage of 0.01 to 2.5 9/m²while the pyrazolidones are used in a coverage of 0.01 to 0.5 g/m².

Included in the silver halide emulsion used herein is a hydrophilic binder which is generally gelatin. Also advantageously gelatin may be modified by partially or entirely replacing by synthetic polymers such as polyvinyl alcohol, poly-N-vinyl pyrrolidone, polyacrylic acid copolymers, and methyl vinyl ether/maleic anhydride copolymers or cellulose derivatives, gelatin derivatives or the like. Various other compounds can be added to the emulsion for the purposes of preventing fogging during development and providing stabilization during preparation or storage as previously described.

In addition to the above-mentioned compounds, there may be used various other additives such as hardeners and surfactants. Exemplary compounds are described in Product Licensing Index, Vol. 92, No. 9232, pages 107–110, I–XIII, XVI–XVII and XXIII (December 1971).

The thus prepared emulsion is coated as a layer on the anti-halation layer by a commonly known technique to form a photosensitive silver halide emulsion layer according to the present invention.

Also included in the printing material is a physical development nucleus layer. Physical development nuclei may be provided by reducing water-soluble salts of noble metals such as gold, silver, platinum and palladium or heavy metals such as zinc, lead, cadmium, nickel, cobalt, iron, chromium, tin, antimony and bismuth to form metal colloids, or by mixing water-soluble salts of such metals, for example, nitrates, acetates, borates, chlorides and hydroxides with water-soluble sulfides such as sodium sulfide.

A hydrophilic binder is used in the physical development nucleus layer. Useful binders are the same hydrophilic polymers as previously described for the photosensitive silver halide emulsion layer, with gelatin, polyvinyl alcohol or methyl vinyl ether/maleic anhydride copolymers or mixtures thereof being preferred. The amount of the hydrophilic binder used ranges from 30% to 100% based on the weight of the physical development nuclei although it varies with a particular type of noble metal or binder.

Preferably the physical development nucleus layer is coated directly on the photosensitive silver halide emulsion layer.

The support for the offset printing material of the invention includes all types of support commonly used in the art, for example, nitrate film, cellulose acetate film, cellulose acetate butyrate film, polystyrene film, polyethylene phthalate film, polycarbonate film, and laminates thereof, as well as paper. Also useful are baryta and paper coated or laminated with α-olefin polymers, especially polymers of α-olefins having 2 to 10 carbon atoms such as polyethylene, polypropylene, and ethylene-butylene copolymers. The supports may be modified by the surface roughening method for providing enhanced bond to other polymers as described in JP-B 19068/1972 or the surface roughening method of JP-B 135840/1981. Another useful support is paper laminated with metal foil such as aluminum foil for minimizing plate elongation.

Colloidal silica may be used in a coating applied to the polyolefin surface for the purposes of improving adhesion to the polyolefin coated surface or improving printability. In this regard, reference is made to U.S. Pat. No. 3,161,519.

To enhance the bonding force between the support and a coating, the support on the surface may be pretreated by corona discharge treatment, ultraviolet exposure or flame treatment. With respect to the corona discharge treatment, reference is made to U.S. Pat. No. 2,018,189.

Hardening of the silver halide emulsion and/or other layers can be achieved by conventional techniques. Useful hardeners include aldehydes such as formaldehyde and glutaraldehyde; ketones such as diacetyl and cyclopentanedione; bis(2-chloroethylurea), 2-hydroxy-4,6-dichloro-1,3,5-triazine; compounds having reactive halogen as described in U.S. Pat. Nos. 3,288,775 and 2,732,303 and UKP 974,723 and 1,167,207; divinyl sulfone, 5-acetyl-1,3-diacryloylhexahydro-1,3,5-triazine; compounds having reactive olefin as described in U.S. Pat. Nos. 3,635,718, 3,232,763, 3,490,911 and 3,642,486 and UKP 994,869; N-hydroxymethylphthalimide; N-methylol compounds as described in U.S. Pat. Nos. 2,732,316 and 2,586,168; isocyanates as described in U.S. Pat. No. 3,103,437; aziridines as described in U.S. Pat. Nos. 3,017,280 and 2,983,611; acid derivatives as described in U.S. Pat. Nos. 2,725,294 and 2,725,295; carbodiimides as described in U.S. Pat. No. 3,100,704; epoxy compounds as described in U.S. Pat. No. 3,091,537; isooxazoles as described in U.S. Pat. Nos. 3,321,313 and 3,543,292; halogenocarboxyaldehydes such as mucochloric acid; and dioxane derivatives such as dihydroxydioxane and dichlorodioxane; as well as inorganic hardeners such as chromium alum and zirconium sulfate. Instead of the foregoing compounds, there may be used precursors, for example, alkali metal bisulfite aldehyde adducts, hydantoin methylol derivatives, and primary aliphatic nitroalcohols.

If desired, well-known surfactants may be added alone or in admixture to any of the layers of the offset printing material. The surfactants may be used as coating aids and as the case may be, used for other purposes, for example, emulsifying dispersion, development acceleration, improvement of photographic properties, electric charge row adjustment, and antistatic purposes.

Included in the surfactant are natural products such as saponin; anionic or nonionic surfactants such as alkylene oxide, glycerines and glycidols; cationic surfactants such as higher alkyl amines, quaternary ammonium salts, pyridine and other heterocyclics, phosphonium and sulfonium; anionic surfactants having an acidic group such as carboxylic acids, sulfonic acids, phosphoric acids, sulfates, phosphates; and ampholytic surfactants such as sulfates and phosphates of amino acids, aminosulfonic acids, and amino-alcohols.

Examples of the surfactant used herein are described in U.S. Pat. Nos. 2,271,623, 2,240,472, 2,288,226, 2,739,891, 3,068,101, 3,158,484, 3,201,253, 3,210,191, 3,294,540, 3,415,649, 3,441,413, 3,442,654, 3,475,774, and 3,545,574, UKP 1,077,317 and 1,198,450, Oda Ryohei et al., "Kaimen-Kasseizai No Gosei To Sono Oyo (Synthesis-of Surfactants and their Application)", Maki-Shoten, 1964, A. W. Perry, "Surface Active Agent", Interscience Publication Inc., 1958, and J. P. Sisley, "Encyclopedia of Active Agent", Vol. 2, Chemical Publish Co., 1964.

As previously described, filter dyes or anti-irradiation dyes may be contained in the offset printing material of the invention. Exemplary dyes are described in U.S. Pat. Nos. 2,274,782, 2,527,583, 2,956,879, 3,177,078 and 3,252,921 and JP-B 22069/1964. These dyes may be mordanted by the method described in U.S. Pat. No. 3,282,699, if desired. The anti-halation layer can be a colored layer containing a pigment such as lamp black, carbon black, fest black, ultramarine, Malachite Green, and Crystal Violet.

Any of well-known coating techniques may be used to coat layers on the support for constituting the offset printing material of the invention. Exemplary techniques include dipping, air knife, and extrusion doctor techniques, with the bead coating technique described in U.S. Pat. No. 2,761,791 being most preferred.

EXAMPLE

Examples of the present invention are given below by way of illustration and not by way of limitation.

Example 1

Preparation of Emulsions

An internal latent image type silver halide emulsion (A) and a surface latent image type silver halide emulsion (a) were prepared by the following procedures.

Emulsion A

With vigorous stirring, an aqueous solution of potassium bromide and an aqueous solution of silver nitrate were concurrently added to an aqueous gelatin solution at 75° C. over 6 minutes, obtaining an emulsion of octahedral silver bromide (AgBr) having a mean grain size of 0.18 μm. Sodium thiosulfate and chloroauric acid tetrahydrate were added to the emulsion, which was heated at 75° C. for 50 minutes for chemical sensitization (core post-ripening). A shell was formed on the thus obtained silver bromide grains as the core by adding the solutions to the emulsion in the presence of ammonium chloroiridate (IV) over 50 minutes under the same precipitation environment as in the first precipitation while controlling the pAg of the emulsion at 7.5, thereby allowing the grains to further grow. There was eventually obtained a monodispersed emulsion of cubic core/shell silver bromide having a mean grain size of 0.40 μm. After water washing and desalting, very minor amounts (as compared with the amounts used for core post-ripening) of sodium thiosulfate and chloroauric acid tetrahydrate were added to the emulsion, which was heated at 75° C. for 60 minutes for effecting weak chemical sensitization (shell post-ripening). There was obtained an internal latent image type silver halide emulsion (A).

Emulsion (a)

An aqueous solution of potassium bromide and an aqueous solution of silver nitrate were concurrently added to an aqueous gelatin solution in the presence of ammonium chloroiridate (IV) at 60° C. over 50 minutes, obtaining an emulsion of cubic silver bromide (AgBr) having a mean grain size of 0.4 μm. After sedimentation and water washing, sodium thiosulfate and chloroauric acid tetrahydrate were added to the emulsion which was treated for chemical sensitization. There was obtained a surface latent image type silver halide emulsion (a).

Preparation of Lithographic Printing Plates

A pre-treated polyester film support on one surface was coated with a matte layer containing silica particles having a mean particle size of 5 μm. The support on the other surface was coated with an anti-halation undercoat layer containing carbon black and 20% by weight based on the photographic gelatin of silica powder having a mean particle size of 7 μm and a layer of emulsion (A) to which $2.5\times10^{-6}$ mol of a nucleating agent N-I-15, $8.8\times10^{-4}$ mol of a nucleation accelerating agent III-1, and $1.2\times10^{-3}$ mol of a sensitizing dye IV-70 were added, the molar amounts being per mol of Ag. The undercoat layer contained 3.1 g/m$^2$ of gelatin, and the emulsion layer contained 1.3 g/m$^2$ of gelatin and had a silver coverage of 1.3 g/m$^2$. Both the undercoat and emulsion layers used formalin as the hardener. On the emulsion layer, a polyvinyl alcohol solution containing PdS nuclei as physical development nuclei was coated and dried, obtaining a lithographic printing plate sample (1-A).

The procedure of plate sample (1-A) was repeated except that emulsion (A) was replaced by emulsion (a), obtaining a lithographic printing plate sample (1-a).

Using a high illuminance sensitometer, these lithographic printing plate samples (1-A) and (1-a) were exposed to a dot image having an area of 5% to 95% of a gray contact screen of 100 to 200 lines/inch for $10^{-6}$ second through an interference filter of 633 nm. They were then processed with each of developers (X-1) to (X-18) and (Y-1) to (Y-9) of the composition shown in Tables 1 and 2.

TABLE 1

| Composition | X-1 | X-2 | X-3 | X-4 | X-5 | X-6 | X-7 | X-8 | X-9 | Y-1 | Y-2 | Y-3 | Y-4 | Y-5 | Y-6 | Y-7 | Y-8 | Y-9 |
|---|---|---|---|---|---|---|---|---|---|---|---|---|---|---|---|---|---|---|
| H$_2$O (ml) | 700 | 700 | 700 | 700 | 700 | 700 | 700 | 700 | 700 | 700 | 700 | 700 | 700 | 700 | 700 | 700 | 700 | 700 |
| KOH (g) | 40 | 40 | 40 | 40 | 40 | 40 | 40 | 40 | 40 | 40 | 40 | 40 | 40 | 40 | 40 | 40 | 40 | 40 |
| Na$_2$SO$_3$ (g) | 100 | 100 | 100 | 100 | 100 | 100 | 100 | 100 | 100 | 100 | 100 | 100 | 100 | 100 | 100 | 100 | 100 | 100 |
| hydroquinone (g) | 40 | 40 | 40 | 40 | 40 | 20 | 30.1 | 35.1 | 60 | 40 | 40 | 40 | 40 | 40 | 20 | 30.1 | 35.1 | 60 |
| 4,4-dimethyl-1-phenyl-3-pyrazolidone (g) | — | — | — | — | — | — | — | — | — | — | — | — | — | — | — | — | — | — |
| metol (g) | 7 | 7 | 7 | 7 | 7 | 7 | 7 | 7 | 7 | 7 | 7 | 7 | 7 | 7 | 7 | 7 | 7 | 7 |
| KBr (g) | 1 | 1 | 1 | 1 | 1 | 1 | 1 | 1 | 1 | 1 | 1 | 1 | 1 | 1 | 1 | 1 | 1 | 1 |
| 5-methylbenzotriazole (g) | 0.05 | 0.05 | 0.05 | 0.05 | 0.05 | 0.05 | 0.05 | 0.05 | 0.05 | 0.05 | 0.05 | 0.05 | 0.05 | 0.05 | 0.05 | 0.05 | 0.05 | 0.05 |
| 2-methylimidazole (g) | 4.0 | 4.0 | 4.0 | 4.0 | 4.0 | 4.0 | 4.0 | 4.0 | 4.0 | — | — | — | — | — | — | — | — | — |
| uracil (g) | — | — | — | — | — | — | — | — | — | 10 | 10 | 10 | 10 | 10 | 10 | 10 | 10 | 10 |
| water to make up 1 liter | | | | | | | | | | | | | | | | | | |
| pH (adjusted) | 11.0 | 12.2 | 11.7 | 10.5 | 10.1 | 11.0 | 11.0 | 11.0 | 11.0 | 11.0 | 12.2 | 11.7 | 10.5 | 10.1 | 11.0 | 11.0 | 11.0 | 11.0 |

TABLE 2

| Composition | X-10 | X-11 | X-12 | X-13 | X-14 | X-15 | X-16 | X-17 | X-18 |
|---|---|---|---|---|---|---|---|---|---|
| H$_2$O (ml) | 700 | 700 | 700 | 700 | 700 | 700 | 700 | 700 | 700 |
| KOH (g) | 40 | 40 | 40 | 40 | 40 | 40 | 40 | 40 | 40 |
| Na$_2$SO$_3$ (g) | 100 | 100 | 100 | 100 | 100 | 100 | 100 | 100 | 100 |
| hydroquinone (g) | 40 | 40 | 40 | 40 | 40 | 40 | 40 | 40 | 40 |
| 4,4-dimethyl-1-phenyl-3-pyrazolidone (g) | 4 | 4 | 4 | 4 | — | — | — | — | — |
| metol (g) | — | — | — | — | 7 | 7 | 7 | 7 | 7 |
| KBr (g) | 1 | 1 | 1 | 1 | 1 | 1 | 1 | 1 | 1 |
| 5-methylbenzotriazole (g) | 0.05 | 0.05 | 0.05 | 0.05 | 0.05 | 0.05 | 0.05 | 0.05 | 0.05 |
| 2-methylimidazole (g) | 4.0 | — | — | — | 4.0 | — | — | — | 4 |
| uracil (g) | — | 7 | — | — | — | 7 | — | — | — |

TABLE 2-continued

| Composition | Developer | | | | | | | | |
|---|---|---|---|---|---|---|---|---|---|
| | X-10 | X-11 | X-12 | X-13 | X-14 | X-15 | X-16 | X-17 | X-18 |
| anhydrous sodium thiosulfate (g) | — | — | 7 | — | — | — | 7 | — | — |
| meso-ionic compound* (g) | — | — | — | 7 | — | — | — | 7 | — |
| 2-methylaminoethanol (g) | — | — | — | — | — | — | — | — | 10 |
| water to make up 1 liter | | | | | | | | | |
| pH (adjusted) | 11.0 | 11.0 | 11.0 | 11.0 | 11.0 | 11.0 | 11.0 | 11.0 | 11.0 |

*Meso-ionic compound is No.1 in the exemplary list.

Immediately after development, the samples were treated with a neutralizing solution of the following composition at 25° C. for 15 seconds, removed of excess water through squeeze rollers, and dried at room temperature.

| Neutralizing solution | |
|---|---|
| Water | 600 ml |
| Citric acid | 11 g |
| Sodium citrate | 36 g |
| Colloidal silica (20% solution) | 6 ml |
| Ethylene glycol | 6 ml |
| Water totaling to | 1 liter |

The lithographic printing plate samples (1-A) and (1-a) were evaluated for resolving power. Using gray contact screens of 100, 133, 150, 175 and 200 lines/inch, the line number of the screen at which a fine network image (5% dot) could be clearly reproduced was determined. The resolving power was evaluated in five ratings from rating 1 (100 lines/inch) to rating 5 (200 lines/inch).

Further each lithographic printing plate prepared using a contact screen was mounted in an offset printing machine, and a desensitizing solution of the following composition was spread throughout the plate surface. The machine was operated for printing while dampening the plate with a fountain solution of the following composition.

Desensitizing solution

| | |
|---|---|
| Water | 550 ml |
| Isopropyl alcohol | 450 ml |
| Ethylene glycol | 50 g |
| Compound A (below) | 1 g |

$$HS-\underset{O}{\overset{N-N}{\diagup\!\!\!\diagdown}}-C_7H_{15}(n)$$

| Fountain solution | |
|---|---|
| o-phosphoric acid | 10 g |
| Nickel nitrate | 5 g |
| Sodium sulfite | 5 g |
| Ethylene glycol | 100 g |
| Colloidal silica (20% solution) | 28 g |
| Water totaling to | 2 liters |

The offset press was A. B. Dick 350CD (trade mark, by A. B. Dick Company). The printing endurance or plate wear was evaluated in accordance with the following criterion based on the number of sheets at which scumming occurred or silver lack (pinholes) disabled printing.

Printing Endurance Criterion 1 up to 1,000 sheets
2 1,001 to 2,000 sheets
3 2,001 to 4,000 sheets
4 4,001 to 6,000 sheets
5 more than 6,000 sheets Ink staining or scumming on white areas was observed. The results are shown in Tables 3 and 4.

TABLE 3

| Run No. | Printing plate | Developer | Development Temp. | Time | Resolving power | Printing endurance | Scumming | Transfer image |
|---|---|---|---|---|---|---|---|---|
| 1 | 1-A | X-1 | 30° C. | 30 sec. | 5 | 3 | no | negative |
| 2 | 1-A | X-2 | 30° C. | 30 sec. | 1 | 1 | some | negative |
| 3 | 1-A | X-3 | 30° C. | 30 sec. | 3 | 2 | no | negative |
| 4 | 1-A | X-4 | 30° C. | 30 sec. | 4 | 3 | no | negative |
| 5 | 1-A | X-5 | 30° C. | 30 sec. | 4 | 3 | no | negative |
| 6 | 1-A | X-6 | 30° C. | 30 sec. | 1 | 1 | some | negative |
| 7 | 1-A | X-7 | 30° C. | 30 sec. | 3 | 3 | no | negative |
| 8 | 1-A | X-8 | 30° C. | 30 sec. | 5 | 3 | no | negative, |
| 9 | 1-A | X-9 | 30° C. | 30 sec. | 5 | 3 | no | negative |
| 10 | 1-A | X-10 | 30° C. | 30 sec. | 5 | 3 | no | negative |
| 11 | 1-A | X-11 | 30° C. | 30 sec. | 5 | 4 | no | negative |
| 12 | 1-A | X-12 | 30° C. | 30 sec. | 5 | 4 | no | negative |
| 13 | 1-A | X-13 | 30° C. | 30 sec. | 5 | 4 | no | negative |
| 14 | 1-A | X-14 | 30° C. | 30 sec. | 5 | 3 | no | negative |
| 15 | 1-A | X-15 | 30° C. | 30 sec. | 5 | 4 | no | negative |
| 16 | 1-A | X-16 | 30° C. | 30 sec. | 5 | 4 | no | negative |
| 17 | 1-A | X-17 | 30° C. | 30 sec. | 5 | 4 | no | negative |
| 18 | 1-A | X-18 | 30° C. | 30 sec. | 4 | 3 | no | negative |

TABLE 4

| Run No. | Printing plate | Developer | Development Temp. | Time | Resolving power | Printing endurance | Scumming | Transfer image |
|---|---|---|---|---|---|---|---|---|
| 19 | 1-a | Y-1 | 30° C. | 30 sec. | 5 | 4 | no | positive |
| 20 | 1-a | Y-2 | 30° C. | 30 sec. | 1 | 2 | scummed | positive |

TABLE 4-continued

| Run No. | Printing plate | Developer | Development Temp. | Time | Resolving power | Printing endurance | Scumming | Transfer image |
|---|---|---|---|---|---|---|---|---|
| 21 | 1-a | Y-3 | 30° C. | 30 sec. | 3 | 3 | some | positive |
| 22 | 1-a | Y-4 | 30° C. | 30 sec. | 4 | 4 | some | positive |
| 23 | 1-a | Y-5 | 30° C. | 30 sec. | 4 | 4 | some | positive |
| 24 | 1-a | Y-6 | 30° C. | 30 sec. | 1 | 2 | scummed | positive |
| 25 | 1-a | Y-7 | 30° C. | 30 sec. | 3 | 4 | some | positive |
| 26 | 1-a | Y-8 | 30° C. | 30 sec. | 5 | 4 | no | positive |
| 27 | 1-a | Y-9 | 30° C. | 30 sec. | 5 | 4 | no | positive |

As seen from Tables 3 and 4, whether the transfer image is negative or positive, lithographic printing materials are excellent in both photographic and printing properties when processed with developers below pH 11.8 containing more than 30 gram/liter of hydroquinone.

It is also seen that in the case of negative type, containment of a silver halide solvent improves printing properties.

The developers were examined for aging stability. Developers (X-1) to (X-18) were shelf stored at 50° C. for one month after their preparation. Lithographic printing material (1-A) was similarly processed with the fresh developer and aged developer and similarly evaluated for resolving power and printing endurance for determining the stability of developer.

Developers (X-1), (X-3) to (X-5), and (X-7) to (X-18) little lowered resolving power and printing endurance after shelf storage, with the results being equivalent to those of fresh ones. The capability of developers (X-2) and (X-6) was low even in the fresh state and was aggravated after storage. Therefore, developers (X-1), (X-3) to (X-5), and (X-7) to (X-18) were outstandingly stable as compared with developers (X-2) and (X-6).

Developers (Y-1) to (Y-9) were also examined for aging stability using lithographic printing material (1-a). Developers (Y-1), (Y-3) to (Y-5), (Y-7) and (Y-8) were stable as compared with developers (Y-2) and (Y-6).

Example 2

The procedure of Example 1 was repeated except that lithographic printing plate sample (1-A) after exposure was developed with developer (X-1) at 30° C. for 30 seconds and then with each of developers (Z-1) to (Z-7) shown in Table 5 at 30° C. for 20 seconds. The results are shown in Table 6.

TABLE 6

| Run No. | Printing plate | 2nd bath developer | Resolving power | Printing endurance | Scumming | Transfer image |
|---|---|---|---|---|---|---|
| 28 | 1-A | Z-1 | 5 | 4 | no | negative |
| 29 | 1-A | Z-2 | 5 | 5 | no | negative |
| 30 | 1-A | Z-3 | 5 | 5 | no | negative |
| 31 | 1-A | Z-4 | 5 | 2 | some | negative |
| 32 | 1-A | Z-5 | 5 | 3 | no | negative |
| 33 | 1-A | Z-6 | 5 | 5 | no | negative |
| 34 | 1-A | Z-7 | 5 | 5 | no | negative |

As seen from Table 6, the presence of a solvent in the second bath tends to increase printing endurance, whereas the second bath causes a loss of printing endurance if its pH is high.

Developers (Z-1) to (Z-7) were examined for aging stability using lithographic printing material (1-A) as in Example 1. Developers (Z-1) to (Z-3) and (Z-5) to (Z-7) were stable as compared with developer (Z-4).

Example 3

Internal latent image type emulsions (B) to (G) and (A') to (G') were prepared by modifying the preparation of emulsion (A) in Example 1. Surface latent image type emulsions (b) to (g) and (b') to (g') were prepared by modifying the preparation of emulsion (a) in Example 1.

Preparation of Emulsion

Emulsion (B)

In forming a shell over the core grains having completed chemical sensitization in emulsion (A), a mix aqueous solution of sodium chloride and potassium bromide containing ammonium chloroiridate (IV) and an aqueous solution of silver nitrate were concurrently added to the emulsion. There was eventually obtained a monodisperse emulsion of cubic core/shell silver chlo-

TABLE 5

| Composition | Developer | | | | | | |
|---|---|---|---|---|---|---|---|
| | Z-1 | Z-2 | Z-3 | Z-4 | Z-5 | Z-6 | Z-7 |
| $H_2O$ (ml) | 700 | 700 | 700 | 700 | 700 | 700 | 700 |
| KOH (g) | 40 | 40 | 40 | 40 | 40 | 40 | 40 |
| $Na_2SO_3$ (g) | 100 | 100 | 100 | 100 | 100 | 100 | 100 |
| hydroquinone (g) | 40 | 40 | 40 | 40 | 40 | 40 | 40 |
| 4,4-dimethyl-1-phenyl-3-pyrazolidone (g) | — | — | — | — | — | — | — |
| metol (g) | 7 | 7 | 7 | 7 | 7 | 7 | 7 |
| KBr (g) | 1 | 1 | 1 | 1 | 1 | 1 | 1 |
| 5-methylbenzotriazole (g) | 0.05 | 0.05 | 0.05 | 0.05 | 0.05 | 0.05 | 0.05 |
| 2-methylimidazole (g) | — | — | — | — | — | — | — |
| uracil (g) | 10 | — | — | — | — | — | — |
| anhydrous sodium thiosulfate (g) | — | 10 | — | 10 | 10 | 10 | 10 |
| meso-ionic compound* (g) | — | — | 10 | — | — | — | — |
| 2-methylaminoethanol (g) | — | — | — | — | — | — | — |
| water to make up 1 liter | | | | | | | |
| pH (adjusted) | 11.0 | 11.0 | 11.0 | 12.2 | 11.7 | 10.5 | 10.1 |

*Meso-ionic compound is No.1 in the exemplary list.

robromide grains (Br 80 mol %) having a mean grain size of 0.40 μm. As in emulsion (A), weak chemical sensitization was effected to yield an internal latent image type emulsion (B).

Emulsion (C)

Like emulsion (B), a monodisperse emulsion (C) of cubic core/shell silver chlorobromide grains (Br 50 mol %) having a mean grain size of 0.40 μm was obtained.

Emulsion (D)

Like emulsion (B), a monodisperse emulsion (D) of cubic core/shell silver chlorobromide grains (Br 20 mol %) having a mean grain size of 0.40 μm was obtained.

Emulsion (E)

Like emulsion (B), a monodisperse emulsion (E) of cubic core/shell silver chlorobromide grains (Br 10 mol %) having a mean grain size of 0.40 μm was obtained.

Emulsion (F)

Like emulsion (B), a monodisperse emulsion (F) of cubic core/shell silver chlorobromide grains (Br 5 mol %) having a mean grain size of 0.40 μm was obtained.

Emulsion (G)

A monodisperse emulsion (G) of cubic core/shell grains having a mean grain size of 0.40 μm was obtained as in emulsion (B) except that the halide solution used in forming a shell was replaced by sodium chloride.

Emulsions (A') to (G')

Emulsions (A') to (G') containing 0.3 mol % of iodine at the grain surface were prepared by adding a KI solution to emulsions (A) to (G) at the end of shell formation, respectively.

Emulsions (b) to (g)

By changing the halogen composition of emulsion (a), there were prepared emulsions of silver chlorobromide or silver chloride.

(b): Br 80 mol %
(c): Br 50 mol %
(d): Br 20 mol %
(e): Br 10 mol %
(f): Br 5 mol %
(g): Cl 100 mol %

Emulsions (a') to (g')

Emulsions (a') to (g') containing 0.3 mol % of iodine at the grain surface were prepared by adding a KI solution to emulsions (a) to (g) at the end of shell formation, respectively.

Preparation of Lithographic Printing Plates

Lithographic printing plates (1-B) to (1-G) and (1-A') to (1-G') were prepared by the same procedure as plate (1-A) in Example 1 except that emulsion (A) was replaced by emulsions (B) to (G) and (A') to (G'), respectively (see Table 7). Lithographic printing plates (1-b) to (1-g) and (1-a') to (1-g') were prepared by the same procedure as plate (1-a) in Example 1 except that emulsion (a) was replaced by emulsions (b) to (g) and (a') to (g'), respectively (see Table 8).

These lithographic printing plates were processed with developers as shown in Tables 7 and 8 and examined for resolving power, printing endurance and scumming.

The results are shown in Tables 7 and 8.

TABLE 7

| Run No. | Printing plate | Emulsion | Halogen composition | Developer | Resolving power | Printing endurance | Scumming | Transfer image |
|---|---|---|---|---|---|---|---|---|
| 35 | 1-B | B | AgBr$_{80}$Cl$_{20}$ | X-1/X-2/X-6 | 5/1/1 | 3/1/1 | no | negative |
| 36 | 1-C | C | AgBr$_{50}$Cl$_{50}$ | X-1/X-2/X-6 | 4/1/1 | 3/1/1 | no | negative |
| 37 | 1-D | D | AgBr$_{20}$Cl$_{80}$ | X-1/X-2/X-6 | 3/1/1 | 2/1/1 | no | negative |
| 38 | 1-E | E | AgBr$_{10}$Cl$_{90}$ | X-1/X-2/X-6 | 3/1/1 | 2/1/1 | no | negative |
| 39 | 1-F | F | AgBr$_5$Cl$_{95}$ | X-1/X-2/X-6 | 3/1/1 | 2/1/1 | some | negative |
| 40 | 1-G | G | AgCl | X-1/X-2/X-6 | 2/1/1 | 2/1/1 | scummed | negative |
| 41 | 1-A' | A' | AgBr$_{99.7}$I$_{0.3}$ | X-1/X-2/X-6 | 5/1/1 | 3/1/1 | no | negative |
| 42 | 1-B' | B' | AgBr$_{79.7}$Cl$_{20}$I$_{0.3}$ | X-1/X-2/X-6 | 5/1/1 | 3/1/1 | no | negative |
| 43 | 1-C' | C' | AgBr$_{49.7}$Cl$_{50}$I$_{0.3}$ | X-1/X-2/X-6 | 4/1/1 | 3/1/1 | no | negative |
| 44 | 1-D' | D' | AgBr$_{19.7}$Cl$_{80}$I$_{0.3}$ | X-1/X-2/X-6 | 4/1/1 | 2/1/1 | no | negative |
| 45 | 1-E' | E' | AgBr$_{9.7}$Cl$_{90}$I$_{0.3}$ | X-1/X-2/X-6 | 3/1/1 | 2/1/1 | no | negative |
| 46 | 1-F' | F' | AgBr$_{4.7}$Cl$_{95}$I$_{0.3}$ | X-1/X-2/X-6 | 3/1/1 | 2/1/1 | some | negative |
| 47 | 1-G' | G' | AgCl$_{99.7}$I$_{0.3}$ | X-1/X-2/X-6 | 2/1/1 | 2/1/1 | scummed | negative |

TABLE 8

| Run No. | Printing plate | Emulsion | Halogen composition | Developer | Resolving power | Printing endurance | Scumming | Transfer image |
|---|---|---|---|---|---|---|---|---|
| 48 | 1-b | b | AgBr$_{80}$Cl$_{20}$ | Y-1/Y-2/Y-6 | 3/1/1 | 3/1/1 | some | positive |
| 49 | 1-c | c | AgBr$_{50}$Cl$_{50}$ | Y-1/Y-2/Y-6 | 3/1/1 | 3/1/1 | some | positive |
| 50 | 1-d | d | AgBr$_{20}$Cl$_{80}$ | Y-1/Y-2/Y-6 | 4/2/1 | 4/2/1 | some | positive |
| 51 | 1-e | e | AgBr$_{10}$Cl$_{90}$ | Y-1/Y-2/Y-6 | 5/2/1 | 5/2/1 | some | positive |
| 52 | 1-f | f | AgBr$_5$Cl$_{95}$ | Y-1/Y-2/Y-6 | 5/2/1 | 5/2/1 | some | positive |
| 53 | 1-g | g | AgCl | Y-1/Y-2/Y-6 | 5/2/1 | 5/2/1 | some | positive |
| 54 | 1-a' | a' | AgBr$_{99.7}$I$_{0.3}$ | Y-1/Y-2/Y-6 | 3/1/1 | 3/1/1 | some | positive |
| 55 | 1-b' | b' | AgBr$_{79.7}$Cl$_{20}$I$_{0.3}$ | Y-1/Y-2/Y-6 | 3/1/1 | 3/1/1 | some | positive |
| 56 | 1-c' | c' | AgBr$_{49.7}$Cl$_{50}$I$_{0.3}$ | Y-1/Y-2/Y-6 | 5/2/1 | 4/2/1 | some | positive |
| 57 | 1-d' | d' | AgBr$_{19.7}$Cl$_{80}$I$_{0.3}$ | Y-1/Y-2/Y-6 | 5/2/1 | 5/2/1 | some | positive |
| 58 | 1-e' | e' | AgBr$_{9.7}$Cl$_{90}$I$_{0.3}$ | Y-1/Y-2/Y-6 | 5/2/1 | 5/2/1 | some | positive |
| 59 | 1-f' | f' | AgBr$_{4.7}$Cl$_{95}$I$_{0.3}$ | Y-1/Y-2/Y-6 | 5/2/1 | 5/2/1 | some | positive |
| 60 | 1-g' | g' | AgCl$_{99.7}$I$_{0.3}$ | Y-1/Y-2/Y-6 | 5/2/1 | 5/2/1 | some | positive |

Emulsions (A') to (G') containing 0.3 mol % of iodine at the grain surface were prepared by adding a KI solution to emulsions (A) to (G) at the end of shell formation, respectively.

It is then evident that various halogen compositions are aggravated in resolving power and printing endurance if the developer has too high pH or too low hydroquinone contents.

There has been described a developer which is capable and stable due to the specific hydroquinone content and pH value. Development of a lithographic printing material therewith results in a silver image which is durable and highly ink receptive.

Although some preferred embodiments have been described, many modifications and variations may be made thereto in the light of the above teachings. It is therefore to be understood that within the scope of the appended claims, the invention may be practiced otherwise than as specifically described.

I claim:

1. A method for processing a lithographic printing material which has been imagewise exposed to light with a developer in accordance with a diffusion transfer process, said lithographic printing material comprising at least a silver halide emulsion layer and a physical development nucleus layer on a support said developer containing a silver halide solvent and at least 30 gram/liter of hydroquinone and having a pH value of up to 11.8.

2. The method of claim 1 wherein said developer containing a silver halide solvent and at least 30 gram/liter of hydroquinone and having a pH value of up to 11.8 is divided into one part for reversal development and another part for dissolution transfer development.

3. The method of claim 1 wherein said silver halide emulsion layer is comprised of an internal latent image type emulsion in which the silver halide composition is silver chlorobromide having a bromine content of at least 45 mol % or silver bromide which may contain iodine on the surface whereby a negative transfer silver image is obtained.

4. The method of claim 1 wherein said silver halide solvent is at least one member selected from the group consisting of thiosulfates, cyclic imine compounds, mesoionic compounds, and amino-alcohol compounds.

* * * * *